(12) United States Patent
Reohr et al.

(10) Patent No.: US 9,384,827 B1
(45) Date of Patent: Jul. 5, 2016

(54) TIMING CONTROL IN A QUANTUM MEMORY SYSTEM

(71) Applicants: William Robert Reohr, Severna Park, MD (US); Steven Brian Shauck, Crofton, MD (US); Donald Lynn Miller, Export, PA (US); Jeremy William Horner, Nottingham, MD (US); Nathan Trent Josephsen, Linthicum Heights, MD (US)

(72) Inventors: William Robert Reohr, Severna Park, MD (US); Steven Brian Shauck, Crofton, MD (US); Donald Lynn Miller, Export, PA (US); Jeremy William Horner, Nottingham, MD (US); Nathan Trent Josephsen, Linthicum Heights, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/639,688

(22) Filed: Mar. 5, 2015

(51) Int. Cl.
| | |
|---|---|
| *G11C 11/44* | (2006.01) |
| *G11C 11/16* | (2006.01) |
| *G11C 19/32* | (2006.01) |
| *B82Y 10/00* | (2011.01) |
| *B82Y 20/00* | (2011.01) |
| *B82Y 25/00* | (2011.01) |

(52) U.S. Cl.
CPC ............... *G11C 11/44* (2013.01); *B82Y 10/00* (2013.01); *B82Y 20/00* (2013.01); *B82Y 25/00* (2013.01); *G11C 11/16* (2013.01); *G11C 11/1659* (2013.01); *G11C 11/1693* (2013.01); *G11C 19/32* (2013.01)

(58) Field of Classification Search
CPC ........ B82Y 10/00; B82Y 20/00; B82Y 25/00; G11C 11/16; G11C 11/1659; G11C 11/1693; G11C 11/44; G11C 19/32
See application file for complete search history.

(56) References Cited

U.S. PATENT DOCUMENTS

| | | | | |
|---|---|---|---|---|
| 4,151,605 | A * | 4/1979 | Faris | G11C 11/44 257/31 |
| 5,323,344 | A * | 6/1994 | Katayama | B82Y 10/00 257/31 |
| 6,389,505 | B1 | 5/2002 | Emma et al. | |
| 6,545,906 | B1 | 4/2003 | Savtchenko et al. | |
| 6,836,141 | B2 * | 12/2004 | Herr | G11C 11/44 326/1 |
| 6,960,929 | B2 * | 11/2005 | Bedard | H03K 17/92 326/1 |
| 8,270,209 | B2 | 9/2012 | Herr et al. | |
| 2005/0047245 | A1 * | 3/2005 | Furuta | G11C 7/06 365/222 |
| 2008/0048902 | A1 * | 2/2008 | Rylov | H03M 1/1215 341/155 |
| 2015/0188337 | A1 * | 7/2015 | Dewa | H02J 7/0024 320/112 |
| 2016/0013791 | A1 * | 1/2016 | Herr | H03K 19/0008 326/5 |

OTHER PUBLICATIONS

Herr, et al.: U.S. Appl. No. 14/043,360, filed Oct. 1, 2013, entitled: *Phase Hysteretic Magnetic Josephson Junction Memory Cell.*
Herr, et al.: U.S. Appl. No. 14/044,220, filed Oct. 2, 2013, entitled: *Josephson AC/DC Converter Systems and Method.*

* cited by examiner

*Primary Examiner* — Vanthu Nguyen
(74) *Attorney, Agent, or Firm* — Tarolli, Sundheim, Covell & Tummino LLP

(57) ABSTRACT

One embodiment describes a quantum memory system. The system includes a plurality of quantum memory cells arranged in an array of rows and columns. Each of the plurality of quantum memory cells can be configured to store a binary logic state in response to write currents in a write operation and configured to provide an indication of the binary logic state in response to read currents in a read operation. The system also includes an array controller comprising a plurality of flux pumps configured to provide the write currents and the read currents with respect to the rows and columns. The array controller can be configured to control timing associated with the write operation and the read operation in response to memory request signals based on application of the write currents and the read currents and based on recharging flux associated with the plurality of flux pumps.

20 Claims, 10 Drawing Sheets

TIMING CONTROL IN A QUANTUM MEMORY SYSTEM

TECHNICAL FIELD

The present invention relates generally to quantum and classical digital superconducting circuits and specifically to timing control in a quantum memory system.

BACKGROUND

Superconducting digital technology has demonstrated the potential to provide computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing applications. All concepts currently considered for superconducting memory have been based on the quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. Additionally, superconducting timing can exhibit fundamentally different timing attributes than other types of memory systems.

SUMMARY

One embodiment describes a quantum memory system. The system includes a plurality of quantum memory cells arranged in an array of rows and columns. Each of the plurality of quantum memory cells can be configured to store a binary logic state in response to write currents in a write operation and configured to provide an indication of the binary logic state in response to read currents in a read operation. The system also includes an array controller comprising a plurality of flux pumps configured to provide the write currents and the read currents with respect to the rows and columns. The array controller can be configured to control timing associated with the write operation and the read operation in response to memory request signals based on application of the write currents and the read currents and based on recharging flux associated with the plurality of flux pumps.

Another embodiment includes a method for reading and writing data in a quantum memory system. The method includes receiving a memory request signal associated with a selected row of an array of quantum memory cells arranged in rows and columns. The method also includes generating one of write currents and read currents from a plurality of flux pumps. The one of the write currents and the read currents can be provided to the array of quantum memory cells to one of write data to and read data from the selected row, respectively, in response to the memory request signal. The method also includes storing an address associated with the selected row in a busy address register based on a predetermined time associated with application of the one of the write currents and the read currents and based on a predetermined time associated with recharging flux associated with the plurality of flux pumps. The method further includes selectively prohibiting access to at least one of the selected row and columns associated with the selected row via the memory request signal until expiration of the predetermined time.

Another embodiment includes a memory system. The memory system includes a memory controller configured to generate memory request signals in response to commands from a central processing unit (CPU). The memory system also includes a quantum memory system. The quantum memory system includes a plurality of quantum memory cells arranged in an array of rows and columns. Each of the plurality of quantum memory cells can be configured to store a binary logic state in response to write currents in a write operation and configured to provide an indication of the binary logic state in response to read currents in a read operation. The quantum memory system also includes an array controller comprising a plurality of flux pumps configured to provide the write currents and the read currents with respect to the rows and columns. The array controller can be configured to control timing associated with the write operation and the read operation in response to memory request signals based on a predetermined time associated with application of the write currents and the read currents and associated with recharging flux associated with the plurality of flux pumps.

DETAILED DESCRIPTION

The present invention relates generally to quantum and classical digital superconducting circuits and specifically to timing control in a quantum memory system. A quantum memory system can include an array of quantum memory cells arranged in rows and columns. The quantum memory cells can be configured as any of a variety of different types of memory cells that implement a Josephson junction superconducting memory element. The quantum memory system also includes an array controller that is configured to control access to the quantum memory cell array with respect to reading data from and writing data to the quantum memory cell array. The array controller can include an address controller that receives memory request signals (e.g., from a memory controller), and in response, can provide addressing signals to a plurality of flux pumps that are configured to provide write currents (e.g., word-write and bit-write currents) and read currents (e.g., word-read and bit-read currents) for accessing the quantum memory cell array. Therefore, the quantum memory cell array can be accessed for write operations and read operations based on very low amplitude current signals provided from the flux pumps.

In addition, the array controller can include at least one timing controller that is configured to control a timing parameter associated with the write operations and the read operations. As an example, the timing controller can monitor the flux pumps to ensure that a given row or set of columns of the quantum memory cell array is prohibited from access based on the write and/or read currents being provided or based on a predetermined time associated with recharging of flux in a given set of the flux pumps. For example, the timing controller can include a timer and a comparator that is configured to compare at least one of a time and a selected row or set of columns with one or more previously selected rows and sets of columns to prohibit access to the selected quantum memory cells based on the associated word-lines and bit-lines being busy or having insufficient flux with respect to the associated flux pumps. Therefore, the memory system can avoid memory access collisions in a Josephson memory system, and can operate, for example, in a more efficient manner by queuing memory requests or by providing memory request signals to access available memory in response to determining that a requested set of memory cells is unavailable.

Figure 1:
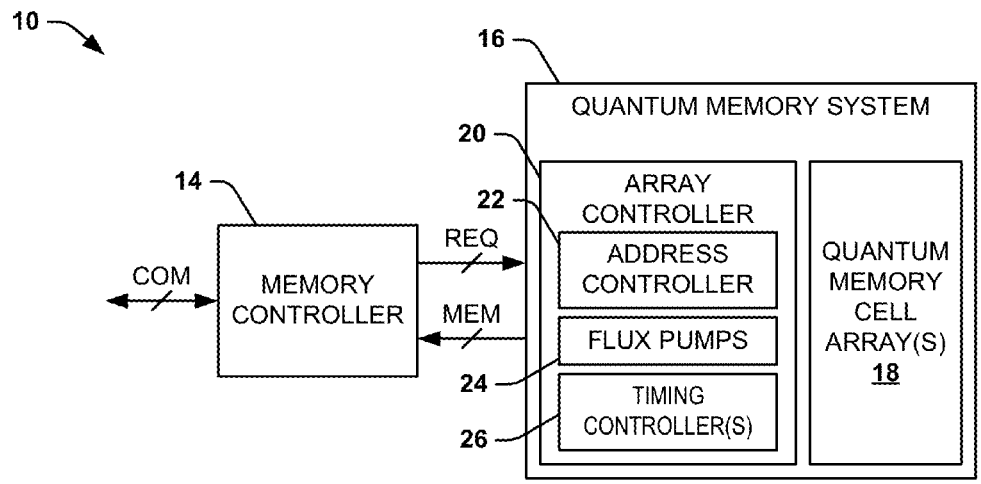
FIG. 1 illustrates an example of a memory system.

FIG. 1 illustrates an example of a memory system 10. The memory system 10 can be implemented as a memory structure in a variety of computing applications, such as in superconducting or hybrid classical and superconducting computer systems. The memory system 10 includes a memory controller 14 that is configured to transmit memory request signals REQ to and to receive memory access signals MEM from a quantum memory system 16. As an example, the quantum memory system 16 may be one of a set of quantum memory systems that are organized into a hierarchical set of memories with respect to caches, buffers, and other known memory systems. In the example of FIG. 1, the memory controller 14 can receive and/or transmit computing signals COM that are associated with memory access, such as from a central processing unit (CPU) with which the memory system 10 can interface. For example, memory system 10 may support any known computation device, such as a field-programmable gate array. As an example, the computing signals COM can include READ, WRITE, and busy signals. Thus, the memory request signals REQ and the memory access signals MEM can be provided based on the computing signals COM.

In the example of FIG. 1, the quantum memory system 16 includes at least one quantum memory cell array 18. Each of the quantum memory cell arrays 18 can include a plurality of quantum memory cells that are arranged in rows and columns. As described herein, the term "quantum memory cell" refers to an addressable cell that includes at least one quantum computing element with which interaction can be provided via flux quanta, such as magnetic Josephson junction(s) (e.g., a Josephson Magnetic Random Access Memory (JMRAM) cell(s)), superconducting circuit(s), and/or qubit(s). The memory request signals REQ can correspond to requests to access portions of the quantum memory cell array(s) 18 associated with the quantum memory system 16 (e.g., a selected row of the rows of quantum memory cells) for reading data from or writing data to the quantum memory cell array(s) 18, such as in response to the computing signals COM. As an example, the memory request signals REQ can include data that is intended to be written to the quantum memory cell array(s) 18 at the selected row that is likewise indicated in the memory request signal REQ. As another example, the memory access signals MEM can correspond to data that is read from the selected row in a read operation.

The quantum memory system 16 also includes an array controller 20 that is configured to control access to the quantum memory cell array(s) 18. In the example of FIG. 1, the array controller 20 includes an address controller 22, a plurality of flux pumps 24, and at least one timing controller 26.

The address controller 22 can be configured to receive the memory request signals REQ and to process them as address information corresponding to the specific rows and columns of the quantum memory cell array(s) 18. The flux pumps 24 are configured to generate write currents and read currents for accessing the rows and columns of the quantum memory cell array(s) 18 during respective write and read operations. As an example, the flux pumps 24 can each include storage inductors that are configured to store magnetic flux energy that can be released as a respective one of a write current (e.g., a word-write current or a bit-write current) or a read current (e.g., a word-read current or a bit-read current), such as based on a quasi-DC/persistent current provided on a respective row or column conductor. The magnetic flux energy can be stored in the flux pumps 24 in a variety of ways, such as via a flux-shuttle loop in which magnetic flux energy is stored in an inductor via incremental current-pulses provided through a flux quantum that is rotated about a loop based on sequential clock-based triggering of Josephson junctions around the flux-shuttle loop. The timing controller(s) 26 can be configured to monitor timing associated with previous accesses of the quantum memory cell array(s) 18 with respect to application of write currents and read currents, as well as a predetermined time for recharging of magnetic flux energy (e.g., "flux", as described herein). Therefore, the timing controller(s) 26 can be configured to provide access to selected portions of the quantum memory cell array(s) 18 (e.g., a selected row of quantum memory cells) based on expiration of a predetermined time associated with a previous access of the selected portions, or based on a predetermined time with recharging flux associated with portions of the quantum memory cell array(s) 18 (e.g., the bit-lines associated with the columns of the quantum memory cell array(s) 18).

Figure 2:
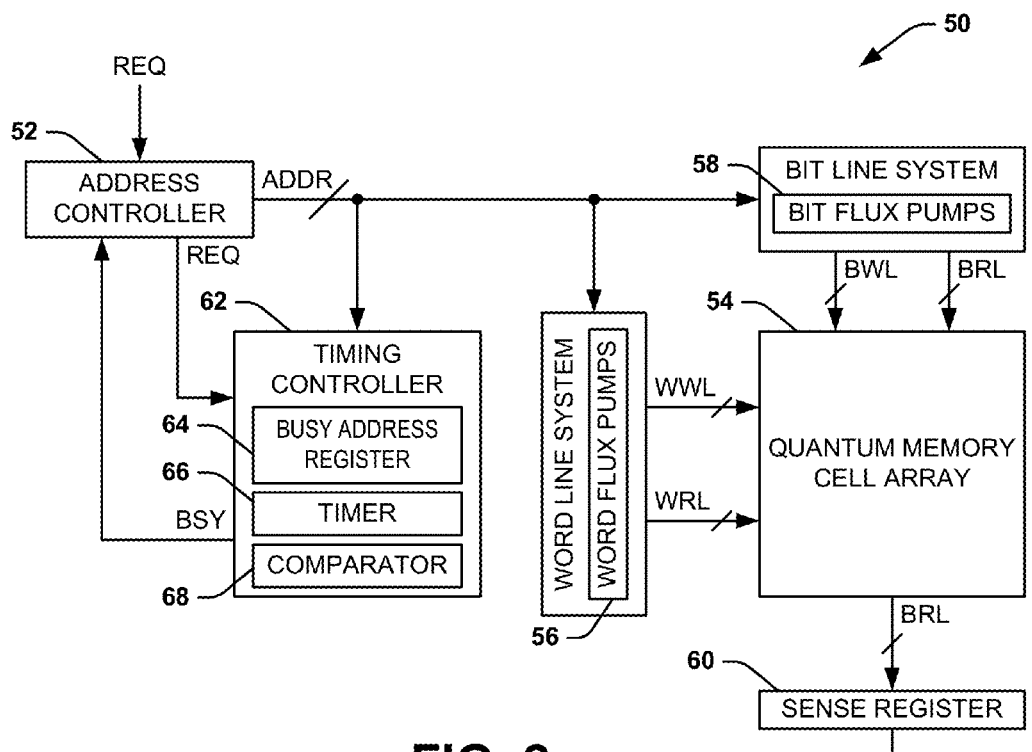
FIG. 2 illustrates an example of a quantum memory system.

FIG. 2 illustrates an example of a quantum memory system 50. The quantum memory system 50 can correspond to the quantum memory system 16 in the example of FIG. 1. Therefore, reference is to be made to the example of FIG. 1 in the following description of the example of FIG. 2.

The quantum memory system 50 includes an address controller 52 that is configured to receive the memory request signals REQ that are provided from the memory controller 14. In response to the memory request signals REQ, the address controller 52 can generate an address signal ADDR that is associated with a selected row in a quantum memory cell array 54 that can correspond to one of the quantum memory cell array(s) 18 in the example of FIG. 1. Thus, the address signal ADDR can select a given row of the quantum memory cell array 54 for a write operation or a read operation. In addition, the quantum memory cell array 54 can include a plurality of interleaved sets of columns, with each set corresponding to a separate and distinct data word within a given one of the rows. Therefore, the address signal ADDR can also be associated with a specific one of the plurality of sets of columns to address a given data word in a respective one of the rows of the quantum memory cell array 54 for the write operation or the read operation.

The address signal ADDR is provided to a set of word flux pumps 56 and to a set of bit flux pumps 58. The word flux pumps 56 can generate a word-write current WWL that is provided on a word-write line associated with the selected row of the quantum memory cell array 54 and a word-read current WRL that is provided on a word-read line associated with the selected row of the quantum memory cell array 54. Similarly, the bit flux pumps 58 can generate a bit-write currents BWL that are provided on bit-write lines associated with the columns of the quantum memory cell array 54 (e.g., a selected set of interleaved columns) and a bit-read current BRL that are provided on bit-read lines associated with the columns of the quantum memory cell array 54. For example, the word flux pumps 56 can include a flux pump associated with each word-write line and each word-read line of the quantum memory cell array 54, and the bit flux pumps 58 can include a flux pump associated with each bit-write line and each bit-read line of the quantum memory cell array 54.

Figure 3:
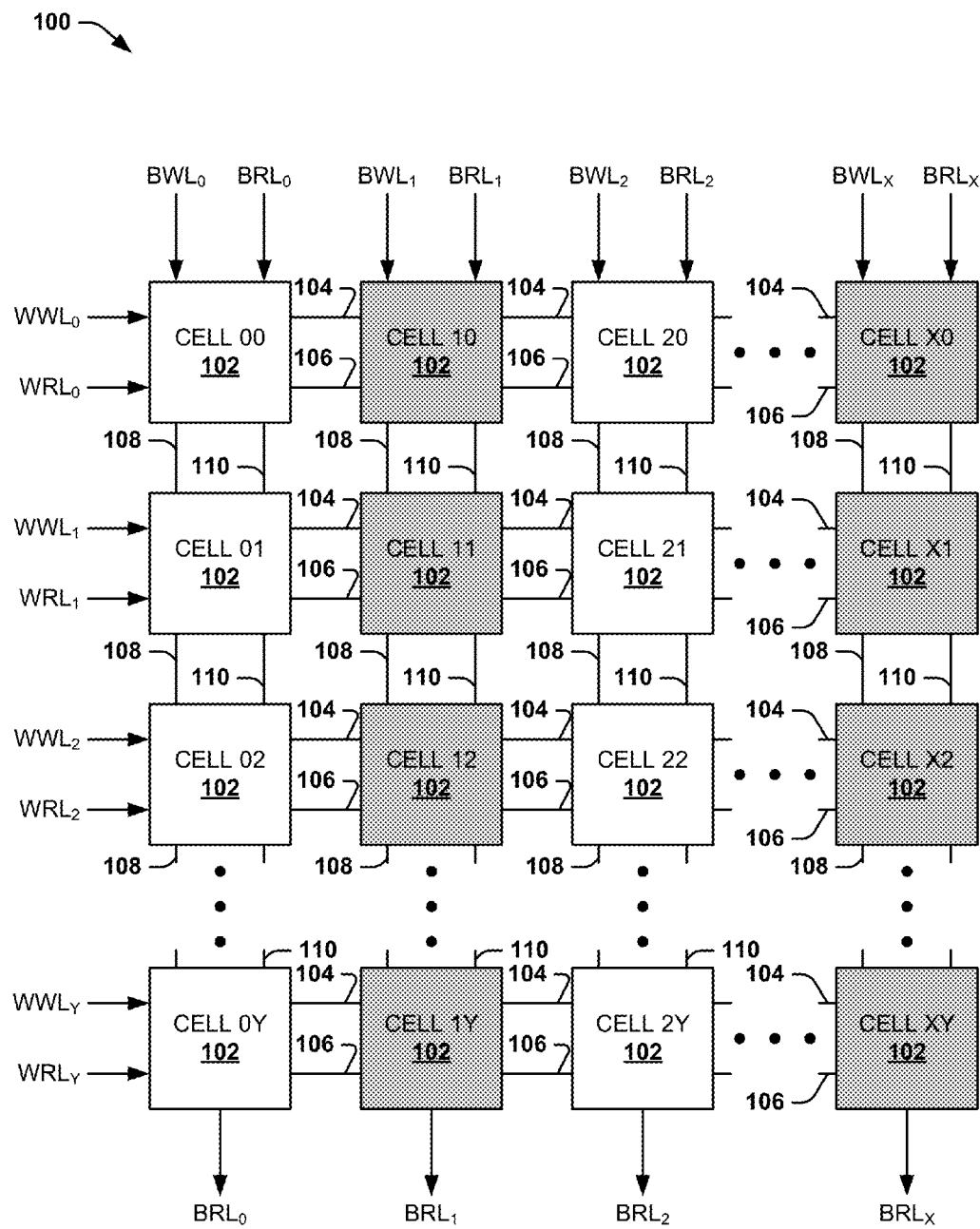
FIG. 3 illustrates an example of a quantum memory cell array.

FIG. 3 illustrates an example of a quantum memory cell array 100. The quantum memory cell array 100 includes a plurality of quantum memory cells 102 that can each be configured to store a single quantum bit of data, such as based on a state of a hysteretic magnetic Josephson junction associated with each respective one of the quantum memory cells 102. The quantum memory cell array 100 can correspond to the quantum memory cell array 54 in the example of FIG. 2. Therefore, reference is to be made to the example of FIG. 2 in the following description of the example of FIG. 3.

In the example of FIG. 3, the quantum memory cells 102 are demonstrated as arranged in an array of rows and columns. Each of the rows of the quantum memory cells 102 can correspond to a data word, with the quantum memory cell array 100 including a plurality of data words numbering from 0 to Y, where Y is an integer greater than one. Each of the rows includes a set of the quantum memory cells 102 that form columns across the rows, with the quantum memory cell array 100 including a plurality of columns numbering from 0 to X, where X is an even integer greater than two. In the example of FIG. 3, even numbered columns (e.g., beginning with column 0) are demonstrated as unshaded, and odd-numbered columns (e.g., beginning with column 1) are shaded. Thus, the shaded and unshaded columns can each correspond to separate sets of columns, and thus to separate and distinct respective data words that can be individually addressed in a given row of the quantum memory cell array 100. Therefore, each of the quantum memory cells 102 in the array of the quantum memory cell array system 100 can be individually addressable by row and one of the sets of columns.

In the example of FIG. 3, each of the rows is demonstrated as having an associated word-write line 104 and word-read line 106. In the example of FIG. 3, the word-write lines 104 are demonstrated as carrying word-write currents $WWL_0$ through $WWL_Y$, and the word-read lines 106 are demonstrated as carrying word-read currents $WRL_0$ through $WRL_Y$. In addition, each of the quantum memory cells 102 is demonstrated as having an associated bit-write line 108 and bit-read line 110. In the example of FIG. 3, the bit-write lines 108 are demonstrated as carrying bit-write currents $BWL_0$ through $BWL_X$, and the bit-read lines 110 are demonstrated as carrying bit-read currents $BRL_0$ through $BRL_Y$. The bit-write line 108 and bit-read line 110 can be coupled to each corresponding numbered memory cell 102 in each of the rows 104 of the quantum memory cell array 100, such that the quantum memory cells 102 in each column 106 are arranged in series with respect to the bit-write line 108 and bit-read line 110. As an example, the word-write lines 104, the word-read line 106, the bit-write lines 108, and the bit-read lines 110 can be inductively, magnetically, capacitively, or otherwise electrically coupled to each of the quantum memory cells 102 in each of the respective rows and columns of the quantum memory cell array 100. Although the example of FIG. 3 describes that the word-write lines 104 and word-read lines 106 and the bit-write lines 108 and bit-read lines 110 are arranged in series with other adjacent memory cells in the respective row and column, the word-write lines 104 and word-read lines 106 and the bit-write lines 108 and bit-read lines 110 could instead be dedicated with respect to each memory cell 102.

Each of the quantum memory cells 102 is configured to store a single bit of data. Specifically, each of the quantum memory cells 102 can include at least one phase hysteretic magnetic Josephson junction that can be configured to store a digital state corresponding to a binary logic-1 or a binary logic-0. The digital state of one or more of the quantum memory cells 102 can be set in response to one of the word-write currents $WWL_0$ through $WWL_Y$ that is provided on the respective word-write line 104 to select the word-write line 104 for the write operation, and a set of the bit-write currents $BWL_0$ through $BWL_X$ (e.g., even or odd numbered bit-write currents $BWL_0$ through $BWL_X$) being provided on the respective bit-write lines 108. Similarly, the respective digital states that are stored in the quantum memory cells 102 can be read from the quantum memory cells 102 based on one of the word-read currents $WRL_0$ through $WRL_Y$ being provided on the respective word-read line 106 to select a given one of the rows 104 for a read operation, and the set of the bit-read currents $BRL_0$ through $BRL_X$ being provided on the respective bit-read lines 110.

Referring back to the example of FIG. 2, the bit-read line 110 of each of the columns is coupled to a sense register 60 that is configured to measure the bit-read current BRL of each respective bit-read line 110 to determine the digital state of each of the quantum memory cells 102 of an associated row. For example, during a read operation, the address signal ADDR can be provided to the word flux pumps 56 to provide one of the word-read currents $WRL_0$ through $WRL_Y$ to select a respective one of the rows of the quantum memory cell array 54, and the address signal ADDR can be provided to the bit flux pumps 58 to provide bit-read currents $BRL_0$ through $BRL_Y$ to read the digital states of the respective quantum memory cells (e.g., the quantum memory cells 102) in the selected row. As an example, the sense register 60 can measure a voltage or a current associated with the bit-read line 110 to provide the memory access signal MEM. For example, the sense register 60 can implement the measurement of the associated bit-read lines 110 during a read operation, or during an initial read in a toggle-write application, such that the state of the quantum memory cells 102 in a given row is measured to determine which of the quantum memory cells 102 are required to change state during the subsequent write operation.

In the example of FIG. 2, the quantum memory system 50 also includes a timing controller 62 that is configured to monitor timing associated with previous accesses of the quantum memory cell array 54 with respect to application of write currents WWL and BWL and the read currents WRL and BRL, as well as a predetermined time for recharging the flux of the word and bit flux pumps 56 and 58. The timing controller 62 includes a busy address register 64, a timer 66, and a comparator 68. The busy address register 64 is configured as a memory to store address information associated with a selected one or more rows of the quantum memory cell array 54 (e.g., previously selected rows). The timer 66 is configured as one or more timers that are configured to monitor a predetermined time period associated with application of the word-write currents WWL, the word-read currents WRL, the bit-write currents BWL, and the bit-read currents BRL. The timer 66 can also be configured to monitor a predetermined time associated with recharging the flux of the word flux pumps 56 and the bit flux pumps 58 to ensure sufficient flux to provide a sufficient amplitude of the word-write currents WWL, the word-read currents WRL, the bit-write currents BWL, and the bit-read currents BRL in subsequent write and read operations. The comparator 68 can thus compare a time or an address associated with a subsequent write and/or read operation to determine whether the quantum memory system 50 should allow the subsequent write and/or read operation at that time, or should prohibit the write and/or read operation at that time.

As an example, in response to receiving the memory request signal REQ associated with a request for a write or a read operation, the address controller 52 can provide the memory request signal REQ to the timing controller 62 to determine if the respective write or read operation is allowed or prohibited. The comparator 68 can thus compare the address information of the selected row in the memory request signal REQ with the previously selected row(s) in the busy address register 64 based on the timer 66 to determine if the write or read operation should be allowed or prohibited. In response to the comparison, the timing controller 62 provides a busy signal BSY to the address controller 52 to provide the indication of the comparison to the address controller 52 (e.g., which can be forwarded to an associated CPU via a computing signal COM). As an example, the busy signal BSY can have a first state indicating allowance of the respective write or read operation and a second state indicating prohibition of the respective write or read operation. In response to an indication of allowance via the busy signal BSY, the address controller 52 can provide the address signal ADDR to the word flux pumps 56 and the bit flux pumps 58 to activate the respective word and bit flux pumps 56 and 58 for the write or read operation. The address controller 52 can also provide the address signal ADDR to the timing controller 62, such that the selected row can be added to the busy address register 64 for a predetermined time, as dictated by the timer 66. In response to an indication of prohibition via the busy signal BSY, the address controller 52 can either queue the write or read operation until the busy signal BSY provides the indication of allowance of the respective write or read operation, or the address controller 52 can select a different row of the quantum memory cell array 54 for a different or the same write or read operation. As an example, the busy signal BSY can include a plurality of different busy signals that correspond to read operations, write operations, and for each different set of columns in both read and write operations. Accordingly, the timing controller 62 can provide for controlled and efficient access to the quantum memory cell array 54 that substantially mitigate address collisions and insufficient flux to drive the respective write currents WWL and BWL and read currents WRL and BRL.

Figure 4:
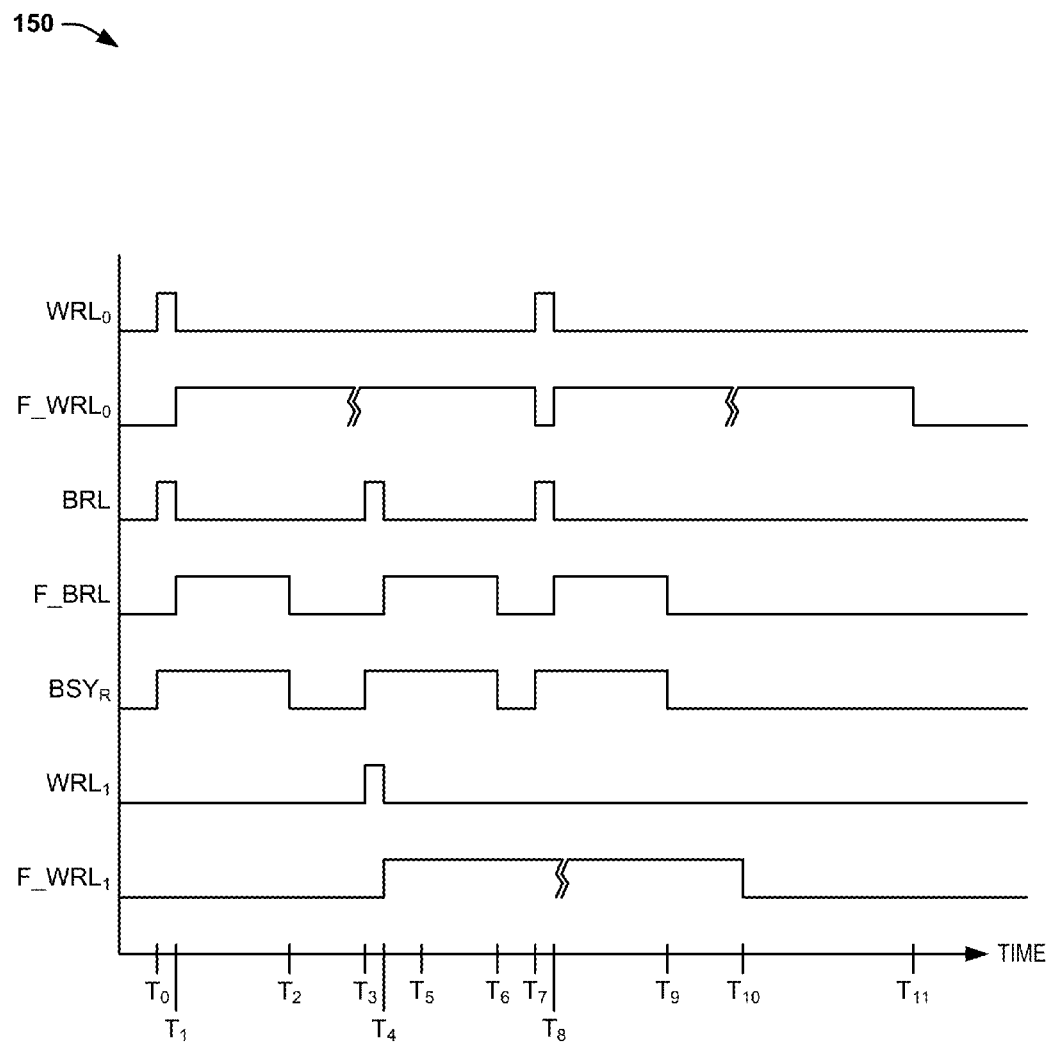
FIG. 4 illustrates an example of a timing diagram.

FIG. 4 illustrates an example of a timing diagram 150. The timing diagram 150 demonstrates timing associated with read operations of a quantum memory system, such as the quantum memory system 50 in the example of FIG. 2. The read operation can be associated with a quantum memory cell array that can include multiple sets of columns that are each associated with a separate and distinct data word in each row, such as the quantum memory cell array 100 in the example of FIG. 3. Therefore, reference is to be made to the example of FIGS. 2 and 3 in the following description of the example of FIG. 4. Additionally, it is to be understood that, in the following description of the example of FIG. 4, the timing diagram 150 is not demonstrated to scale, and is demonstrated as an ideal timing diagram. Thus, it is to be understood that on-delays and off-delays that may exist or may be required to exist with respect to the signals relative to each other are not demonstrated in the example of FIG. 4.

At a time $T_0$, the word-read current $WRL_0$ is asserted via a respective one of the word flux pumps 56, and bit-read currents BRL associated with the columns are likewise asserted, such as via respective bit flux pumps 58. Therefore, a given data word associated with the $0^{th}$ row and the columns can be read by the sense register 60, such as over a given one clock cycle. Upon expiration of the read operation (e.g., after one clock cycle), the word-read current $WRL_0$ and the bit-read currents BRL are de-asserted at a time $T_1$. Beginning at the time $T_1$, the flux pump that provided the word-read current $WRL_0$ begins to recharge, demonstrated in the example of FIG. 4 by a signal $F\_WRL_0$, and the flux pumps that provided the bit-read currents BRL likewise begin to recharge, demonstrated in the example of FIG. 4 by a signal F_BRL.

During the recharging of the flux $F\_WRL_0$ in the $0^{th}$ word-line and the flux F_BRL in the bit-lines, the word-read current $WRL_0$ and the bit-read currents BRL cannot be applied again for a respective read operation. In the example of FIG. 4, the time associated with recharging the flux $F\_WRL_0$ of the word-read current $WRL_0$ can have a much longer duration (e.g., approximately fifty clock cycles), to a time $T_7$, relative to a duration associated with recharging the flux F_BRL of the bit-read currents BRL (e.g., approximately six clock cycles), to a time $T_2$, such as based on characteristics the quantum memory cell array 54. However, because flux-quantized deltas to the bit-read currents BRL are generated within each of the quantum memory cells along a selected row of the quantum memory cell array 54, another data word associated with the columns cannot be accessed until the flux F_BRL of the bit-read currents BRL has been recharged so that a DC persistent current-level is restored in the bit lines. Therefore, from the time $T_0$ to the time $T_2$, a busy signal $BSY_R$ associated with reading based on the columns can be asserted to indicate to the address controller 52 that read operations are to be prohibited. Furthermore, the address controller 52 can be provided indication that the flux $F\_WRL_0$ of the word-read current $WRL_0$ is recharging, thus rendering read operations associated with the $0^{th}$ word-line to be prohibited. For example, the timing controller 62 can provide a separate busy signal (not shown), or the timing controller 62 can maintain a clock signal during the predetermined time duration of recharge of the flux $F\_WRL_0$ of the word-read current $WRL_0$.

At the time $T_2$, the busy signal $BSY_R$ is de-asserted to indicate to the address controller 52 that read operations can be allowed. At a time $T_3$, the word-read current $WRL_1$ is asserted via a respective one of the word flux pumps 56, and the bit-read currents BRL associated with the columns are likewise asserted via respective bit flux pumps 58. Therefore, a given data word associated with the $1^{st}$ row can be read by the sense register 60, such as over a given one clock cycle. Upon expiration of the read operation (e.g., after one clock cycle), the word-read current $WRL_1$ and the bit-read currents BRL are de-asserted at a time $T_4$. Beginning at the time $T_4$, the flux pump that provided the word-read current $WRL_1$ begins to recharge, demonstrated in the example of FIG. 4 by a signal $F\_WRL_1$, and the flux pumps that provided the bit-read currents BRL likewise begin to recharge, demonstrated in the example of FIG. 4 by a signal F_BRL.

During the recharging of the flux $F\_WRL_1$ in the $1^{st}$ word-line and the flux F_BRL in the bit-lines, the word-read current $WRL_1$ and the bit-read currents BRL cannot be applied again for a respective read operation. Similar to as described previously, the time associated with recharging the flux $F\_WRL_1$ of the word-read current $WRL_1$ may have a much longer duration (e.g., approximately fifty clock cycles), to a time $T_{10}$, relative to a duration associated with recharging the flux F_BRL of the bit-read currents BRL (e.g., approximately six clock cycles), to a time $T_6$. Thus, from the time $T_3$ to the time $T_6$, the busy signal $BSY_R$ associated with reading can be asserted to indicate to the address controller 52 that read operations are to be prohibited. Additionally, the address controller 52 can be provided indication that the flux $F\_WRL_1$ of the word-read current $WRL_1$ is recharging, thus rendering read operations associated with the $1^{st}$ word-line to be prohibited.

At a time $T_7$, the signal corresponding to the flux $F\_WRL_0$ associated with the $0^{th}$ row is de-asserted to indicate that the word-read current $WRL_0$ is available for read operations. Thus, at the time $T_7$, the word-read current $WRL_0$ is asserted via a respective one of the word flux pumps 56, and bit-read currents BRL associated with the columns are likewise asserted via respective bit flux pumps 58. Therefore, a given data word associated with the $0^{th}$ row can be read by the sense register 60, such as over a given one clock cycle. Upon expiration of the read operation (e.g., after one clock cycle), the word-read current $WRL_0$ and the bit-read currents BRL are de-asserted at a time $T_8$. Beginning at the time $T_8$, the flux pump that provided the word-read current $WRL_0$ begins to recharge, demonstrated in the example of FIG. 4 by a signal $F\_WRL_0$, and the flux pumps that provided the bit-read currents BRL likewise begin to recharge, demonstrated in the example of FIG. 4 by a signal $F\_BRL$.

During the recharging of the flux $F\_WRL_0$ in the $0^{th}$ word-line and the flux $F\_BRL$ in the bit-lines, the word-read current $WRL_0$ and the bit-read currents BRL cannot be applied again for a respective read operation. Similar to as described previously, the time associated with recharging the flux $F\_WRL_0$ of the word-read current $WRL_0$ can have a much longer duration (e.g., approximately fifty clock cycles), to a time $T_{11}$, relative to a duration associated with recharging the flux $F\_BRL$ of the bit-read currents BRL (e.g., approximately six clock cycles), to a time $T_9$. Thus, from the time $T_7$ to the time $T_9$, the busy signal $BSY_R$ can be asserted to indicate to the address controller 52 that read operations are to be prohibited. Furthermore, the address controller 52 can be provided indication that the flux $F\_WRL_0$ of the word-read current $WRL_0$ is recharging, thus rendering read operations associated with the $0^{th}$ word-line to be prohibited. For example, the timing controller 62 can provide a separate busy signal (not shown), or the timing controller 62 can maintain a clock signal during the predetermined time duration of recharge of the flux $F\_WRL_0$ of the word-read current $WRL_0$.

Figure 5:
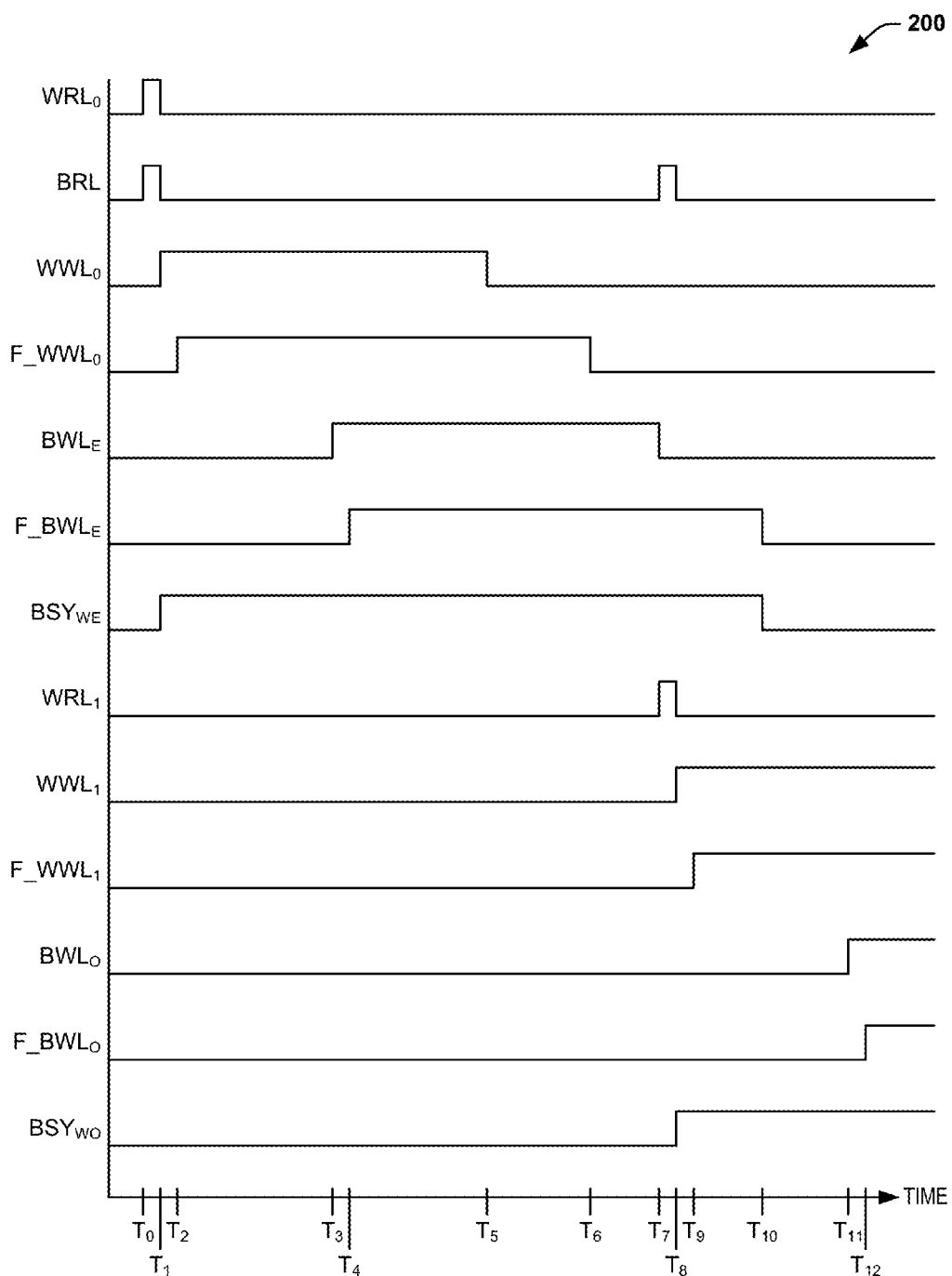
FIG. 5 illustrates another example of a timing diagram.

FIG. 5 illustrates another example of a timing diagram 200. The timing diagram 200 demonstrates timing associated with write operations of a quantum memory system, such as the quantum memory system 50 in the example of FIG. 2. The write operations can be associated with a quantum memory cell array that can include multiple sets of columns that are each associated with a separate and distinct data word in each row, such as the quantum memory cell array 100 in the example of FIG. 3. Therefore, reference is to be made to the example of FIGS. 2 and 3 in the following description of the example of FIG. 5. Additionally, it is to be understood that, in the following description of the example of FIG. 5, the timing diagram 200 is not demonstrated to scale, and is demonstrated as an ideal timing diagram. Thus, it is to be understood that on-delays and off-delays that may exist or may be required to exist with respect to the signals relative to each other are not demonstrated in the example of FIG. 5. In addition, the example of FIG. 5 is demonstrated independently of the example of FIG. 4, such that the times demonstrated in FIG. 5 are unrelated to the times demonstrated in the example of FIG. 5.

In the example of FIG. 5, the write operations may be toggle write operations, such that a state of each bit of the digital word can be read before the write and only the bits to which a change of state is required are written. Thus, at a time $T_0$, the word-read current $WRL_0$ is asserted via a respective one of the word flux pumps 56, and bit-read currents BRL associated with the columns (e.g., the unshaded quantum memory cells 102) are likewise asserted via respective bit flux pumps 58. Therefore, a given data word associated with the $0^{th}$ row can be read by the sense register 60, such as over a given one clock cycle. Upon expiration of the read operation (e.g., after one clock cycle), the word-read current $WRL_0$ and the bit-read currents BRL are de-asserted at a time $T_1$. Beginning at the time $T_1$, the flux pump that provided the word-read current $WRL_0$ begins to recharge, similar to as described previously in the example of FIG. 4.

Also beginning at the time $T_1$, the word-write current $WWL_0$ is asserted via a respective one of the word flux pumps 56. Beginning at a time $T_2$ just subsequent to the time $T_1$, the flux pump that provides the word-write current $WWL_0$ begins to recharge, demonstrated in the example of FIG. 5 by a signal $F\_WWL_0$. At a time subsequent to the time $T_2$ (e.g., several clock cycles), beginning at a time $T_3$, the bit-write currents $BWL_E$ associated with the even columns (e.g., the unshaded quantum memory cells 102) are likewise asserted via respective bit flux pumps 58. Because the write operations can be toggle write operations, as an example, only the relevant even bit-write currents $BWL_E$ (e.g., those requiring a logic-state change) can be applied in the write operation described herein. Beginning at a time $T_4$ just subsequent to the time $T_3$, the flux pumps that provide the even bit-write currents $BWL_E$ begin to recharge, demonstrated in the example of FIG. 5 by a signal $F\_BWL_E$. The word-write current $WWL_0$ can continue to be provided until a time $T_5$, with the flux $F\_WWL_0$ being recharged until a time $T_6$ thereafter. Similarly, the bit-write currents $BWL_E$ can continue to be provided until a time $T_7$, with the flux $F\_BWL_E$ of the bit-write currents $BWL_E$ being recharged until a time $T_{10}$ thereafter.

Therefore, data can be written to a given data word associated with the $0^{th}$ row and the even columns based on application of the word-write current $WWL_0$ and the even bit-write currents $BWL_E$. As described previously, the write operations in the example of FIG. 5 can be toggle write operations, such that a state of each bit of the digital word can be read before the write and only the bits to which a change of state is required are written. Therefore, in the example of FIG. 5, the word-write current $WWL_0$ and the even bit-write currents $BWL_E$ are demonstrated as staggered such that a magnetic domain of the respective quantum memory cells 102 are rotated to the opposite state. Additionally, while the example of FIG. 5 demonstrates that the staggered application of the word-write current $WWL_0$ and the even bit-write currents $BWL_E$ is demonstrated as beginning with the word-write current $WWL_0$, it is to be understood that the staggered application of the word-write current $WWL_0$ and the even bit-write currents $BWL_E$ can instead begin with application of the even bit-write currents $BWL_E$, followed by the word-write current $WWL_0$.

During the recharging of the flux $F\_WWL_0$ in the $0^{th}$ word-line and the flux $F\_BWL_E$ in the even bit-lines, the word-write current $WWL_0$ and the even bit-write currents $BWL_E$ cannot be applied again for a respective write operation. Because the even bit-write currents $BWL_E$ are provided to every row of the quantum memory cell array 54, another data word associated with the even columns cannot be accessed until the flux $F\_BWL_E$ of the even bit-write currents $BWL_E$ has been recharged. Additionally, because the write operation includes application of both a word-write current (e.g., the word-write current $WWL_0$) and bit-write currents (e.g., the even bit-write currents $BWL_E$), another write operation cannot be performed during the entirety of the application of the word-write current and the bit-write currents. Therefore, from the time $T_1$ to the time $T_{10}$, a busy signal $BSY_{WE}$ associated with writing based on the even columns can be asserted to indicate to the address controller 52 that write operations associated with the even columns are to be prohibited. Additionally, the address controller 52 can be provided indication as to when the even bit-write currents $BWL_E$ are no longer asserted to allow write operations on a different row via the odd columns, as described in greater detail herein. For example, the timing controller 62 can provide a separate busy signal (not shown), or the timing controller 62 can maintain a clock signal during application of the even bit-write currents $BWL_E$.

At the time $T_7$, upon de-assertion of the even bit-write currents $BWL_E$, the address controller 52 can be indicated by the timing controller 62 that write operations associated with the odd columns are allowed. Thus, at the time $T_7$, the word-read current $WRL_1$ is asserted via a respective one of the word flux pumps 56, and bit-read currents BRL associated with the columns are likewise asserted via respective bit flux pumps 58. Therefore, a given data word associated with the $1^{st}$ row can be read by the sense register 60, such as over a given one clock cycle. Upon expiration of the read operation (e.g., after one clock cycle), the word-read current $WRL_1$ and the bit-read currents BRL are de-asserted at a time $T_8$. Beginning at the time $T_8$, the flux pump that provided the word-read current $WRL_1$ begins to recharge, similar to as described previously in the example of FIG. 4.

Also beginning at the time $T_8$, the word-write current $WWL_1$ is asserted via a respective one of the word flux pumps 56. Beginning at a time $T_9$ just subsequent to the time $T_8$, the flux pump that provides the word-write current $WWL_1$ begins to recharge, demonstrated in the example of FIG. 5 by a signal $F\_WWL_1$. At a time subsequent to the time $T_9$ (e.g., several clock cycles), beginning at a time $T_{11}$, the bit-write currents $BWL_O$ associated with the odd columns (e.g., the shaded quantum memory cells 102) are likewise asserted via respective bit flux pumps 58. Because the write operations can be toggle write operations, as an example, only the relevant odd bit-write currents $BWL_O$ (e.g., those requiring a logic-state change) can be applied in the write operation described herein. Beginning at a time $T_{12}$ just subsequent to the time $T_{11}$, the flux pumps that provide the odd bit-write currents $BWL_O$ begin to recharge, demonstrated in the example of FIG. 5 by a signal $F\_BWL_O$. The word-write current $WWL_1$ can continue to be provided until a subsequent time, with the flux $F\_WWL_1$ being recharged until a time thereafter. Similarly, the bit-write currents $BWL_E$ can continue to be provided until a subsequent time, with the flux $F\_BWL_O$ of the bit-write currents $BWL_O$ being recharged until a time thereafter.

Therefore, data can be written to a given data word associated with the $1^{st}$ row and the odd columns based on application of the word-write current $WWL_1$ and the odd bit-write currents $BWL_O$. As described previously, the write operations in the example of FIG. 5 can be toggle write operations, such that a state of each bit of the digital word can be read before the write and only the bits to which a change of state is required are written. Therefore, in the example of FIG. 5, the word-write current $WWL_1$ and the odd bit-write currents $BWL_O$ are demonstrated as staggered such that a magnetic domain of the respective quantum memory cells 102 are rotated to the opposite state. Additionally, while the example of FIG. 5 demonstrates that the staggered application of the word-write current $WWL_1$ and the odd bit-write currents $BWL_O$ is demonstrated as beginning with the word-write current $WWL_1$, it is to be understood that the staggered application of the word-write current $WWL_1$ and the odd bit-write currents $BWL_O$ can instead begin with application of the odd bit-write currents $BWL_O$, followed by the word-write current $WWL_1$.

During the recharging of the flux $F\_WWL_1$ in the $1^{st}$ word-line and the flux $F\_BWL_O$ in the odd bit-lines, the word-write current $WWL_1$ and the odd bit-write currents $BWL_O$ cannot be applied again for a respective write operation. Because the odd bit-write currents $BWL_O$ are provided to every row of the quantum memory cell array 54, another data word associated with the odd columns cannot be accessed until the flux $F\_BWL_O$ of the odd bit-write currents $BWL_O$ has been recharged. Additionally, because the write operation includes application of both a word-write current (e.g., the word-write current $WWL_1$) and bit-write currents (e.g., the odd bit-write currents $BWL_O$), another write operation cannot be performed during the entirety of the application of the word-write current and the bit-write currents. Therefore, from the time $T_8$ to a time thereafter (e.g., through expiration of a time associated with recharging the flux $F\_BWL_O$), a busy signal $BSY_{WO}$ associated with writing based on the odd columns can be asserted to indicate to the address controller 52 that write operations associated with the odd columns are to be prohibited. Additionally, the address controller 52 can be provided indication as to when the odd bit-write currents $BWL_O$ are no longer asserted to allow write operations on a different row via the even columns, as described previously. For example, the timing controller 62 can provide a separate busy signal (not shown), or the timing controller 62 can maintain a clock signal during application of the even bit-write currents $BWL_O$.

As described herein in the examples of FIGS. 4 and 5, the timing controller 62 can be configured to maintain a time associated with the respective read and write operations to allow or prohibit read and write operations associated with the quantum memory cell array 54. Thus, the timing controller 62 can provide an assortment of busy signals (e.g., the busy signals $BSY_R$, $BSY_{WE}$, and $BSY_{WO}$, and/or a variety of others), such as via the timer(s) 66, to provide an indication of unavailable rows and columns of the quantum memory cell array 54 to the address controller 52 for purposes of addressing the quantum memory cell array 54 in read and/or write operations. It is to be understood that the timing diagrams 150 and 200 are not limited to the examples of FIGS. 4 and 5. For example, additional or alternate busy signals can be generated, and the operations and order of operations demonstrated herein are provided solely by example, such that the timing controller 62 can be configured to track any combination of read and write operations to selectively allow and prohibit subsequent read and/or write operations. Accordingly, the timing controller 62 can operate in any of a variety of ways.

Figure 6:
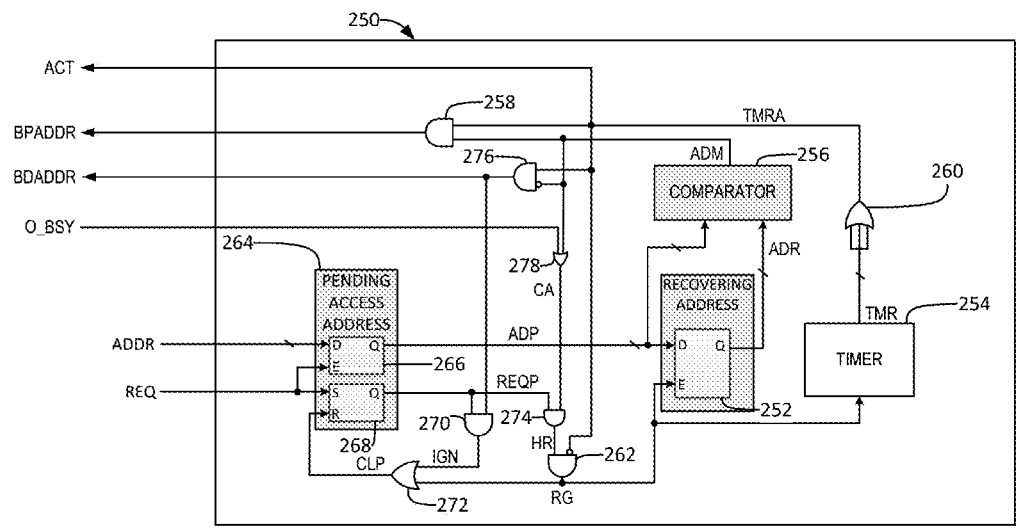
FIG. 6 illustrates an example of a timing controller.

FIG. 6 illustrates an example of a timing controller 250. The timing controller 250 can correspond to the timing controller 62 in the example of FIG. 2, and can be configured to monitor timing of read operations, such as described in the example of FIG. 4, and write operations, such as described in the example of FIG. 5. Therefore, reference is to be made to the example of FIGS. 2-5 in the following description of the example of FIG. 6. Additionally, the timing controller 250 can correspond to a single timing controller to generate a single busy signal BSY. Thus, the timing controller 62 in the example of FIG. 2 can include a plurality of timing controllers 250 that can each generate separate respective busy signals BSY (e.g., the busy signals $BSY_R$, $WL\_BSY_{wO}$, and $WL\_BSY_{W1}$, and/or a variety of others).

The timing controller 250 includes a pending access address register 264. The pending access address register is configured as a memory to store address information associated with a request and information associated with that request indicating whether that request is waiting to be granted. The pending access address register 264 includes an address pending memory 266 and a request pending memory 268. Thus, in response to receiving an access request signal REQ and an address ADDR associated with the request, the address pending memory 266 stores the address to which access is being requested and makes this value available via the signal ADP, and the request pending memory 268 is set in order to indicate that an access has been requested and is pending. The request pending memory 268 indicates via the signal REQP the state of the access request to the address indicated by the signal ADP. If the signal REQP has the value of a logic 0, then there is no pending access request. If, however, the signal REQP has the value of a logic 1, then there is a pending request to the address indicated by signal ADP which is waiting for a not-busy state to be granted.

The timing controller 250 includes an A-and-not-B logic gate 262 which is used to determine when a pending access is granted access to the requested memory location. The A-and-not-B logic gate 262 indicates via a signal RG when the conditions have been met to grant the access request. The required conditions are that the signal HR must indicate that the requested pending access shall be honored and that the signal TMRA must indicate that the busy tracking state is not active.

The timing controller 250 includes an AND logic gate 270 which is used to determine when a pending access request is to be ignored by the timing controller 250. The AND logic gate 270 indicates via signal IGN when the conditions have been met to ignore the access request. The required conditions are that the signal REQP indicates that a pending access request is present and the signal BDADDR indicates that the timing controller 250 is busy tracking the recovery of an address that does not match the address of the pending access request.

The timing controller 250 includes an OR logic gate 272 which is used to determine when to clear the memory of the request pending memory 268 in order to indicate that the access request to the address stored in the address pending memory 266 is no longer considered pending. The OR logic gate 272 indicates via a signal CLP when the conditions have been met to clear the memory of the address pending memory 266. The required condition is that either the pending access request must be granted, indicated by a logic 1 via the signal RG, or the pending access request must be ignored, indicated by a logic 1 via the signal IGN.

The timing controller 250 includes a recovering address register 252 which is configured as a memory to store address information associated with a selected row of the quantum memory cell array 54 (e.g., a previously selected row). Thus, in response to receiving an indication via the signal RG that an access request has been granted, the recovering address memory 252 stores the address, indicated by the signal ADP, to which access has been granted and makes this value available via the signal ADR.

The timing controller 250 includes a timer 254 which is configured to countdown from a predetermined value to zero and to hold the value of zero. The timer 254 is configured to start its countdown upon receipt of an indication via the signal RG and to provide the current value of the counter via a signal TMR. In the example of FIG. 6, the timer 254 is used to track the busy state of the recovering address stored in the recovering address register 252. When a non-zero value is indicated via the signal TMR, the address stored in the recovering address register 252 is considered busy or recovering. When the value indicated via the signal TMR is equal to zero, the flux pumps associated with the address ADR have recovered and are no longer considered busy.

The timing controller 250 includes an OR logic gate 260 which is configured to perform the logical OR of all of the bits comprising the signal TMR and indicate the result of this function via the signal TMRA. Therefore, in the example of FIG. 6, the signal TMRA can be used to determine whether the timer 254 is actively counting down, indicating that the recovering address is busy, or whether the timer 254 has reached its terminal value of zero indicating that the address stored in the recovering address register 252 has recovered and is no longer considered busy.

The timing controller 250 also includes a comparator 256 that is configured to compare a currently selected row/address, stored in the pending address register 266 and indicated via the signal ADP, with a previously selected row/address, stored in the recovering address register 252 and indicated via the signal ADR. The comparator 256 indicates the result of this comparison via the signal ADM where a logical value of 1 indicates that the two addresses match and a logical value of 0 indicates that the two addresses do not match.

The timing controller 250 also includes an AND logic gate 258 which is configured to generate a busy signal BPADDR when the signal ADM indicates that the address stored in the pending access address memory 266 matches the recovering address stored in the recovering address memory 252 and when the TMRA signal indicates that the address stored in the recovering address memory 252 is present recovering and is in the busy state.

The timing controller 250 includes an A-and-not-B logic gate 276 which is used to determine when the timing controller 250 is busy tracking the recovery of an address that does not match the address stored in the address pending memory 266 and indicated via the signal ADP. The A-and-not-B logic gate 276 indicates via a signal BDADDR when the signal TMRA indicates that the timing controller 250 is busy and when the signal ADM has the logic value-0 indicating that the address associated with the pending access request does not match the address that is recovering.

The timing controller 250 includes an OR logic gate 278 which is used to determine when the timing controller 250 should conditionally accept a pending access request, and the OR logic gate 278 indicates this conditional acceptance via the signal CA when one of two conditions are met. The first condition is when it has been determined that all preceding timing controllers (if present) are busy with access requests to addresses that do not match the value stored in the pending access address 266, and that there are no other timing controllers that are actively tracking the recovery of the address matching signal ADP. The input signal O_BSY is used to indicate to the timing controller 250 that this first condition has been met. The second condition is when the signal ADM indicates that the address indicated by the ADP signal matches the previously selected address indicated via the signal ADR.

The timing controller 250 includes an AND logic gate 274 which performs the logical AND of the signal REQP and the signal CA to determine when the timing controller 250 should honor the pending request to access the address indicated by the signal ADP. The AND logic gate 274 is configured to indicate via the signal HR that the timing controller 250 should honor the requested access.

The timing controller 62 in the example of FIG. 2 can correspond to a single timing controller 250 operating independently of other timing controllers, or the timing controller 62 in the example of FIG. 2 can correspond to multiple timing controllers 250 operating cooperatively to cover a plurality of addresses where the number of addresses can equal or exceed the number of timing controllers 250.

The circuitry that comprises the timing controller 250 can be categorized into one or more than one of several categories. As an example, circuitry can be categorized as being associated with tracking the recovery and busy state of the address and its associated circuitry (e.g. flux pumps). As another example, circuitry can also be categorized as being associated with queuing and/or with queue admittance of access requests to the busy state tracking circuitry. As yet another example, circuitry can be categorized as being associated with the coordination of the timing controller 250 with other instances of the same timing controller 250 so that as a whole they can operate in a cooperative fashion.

For example, the address pending memory 266 and the recovering address register 252 can be viewed as a queue. An address associated with an access request is received via the input signals REQ and ADDR and is stored in the address pending memory 266 until the queue admittance circuitry determines whether the pending access request will be ignored or granted. If the queue admittance circuitry in the timing controller 250 determines that the access request will be granted, then three coordinated actions will take place. The first action is that the address stored in the address pending memory 266 is transferred along the queue to the recovering address register 252 via signal ADP. The second action is that the request pending memory 268 is cleared which indicates that the value stored in the address pending memory 266 is no longer considered pending, and the address that it had stored has moved along the queue to the recovering address register 252. The third action is that the countdown timer will be signaled to begin its countdown to zero from its predetermined value via the signal RG.

Figure 7:
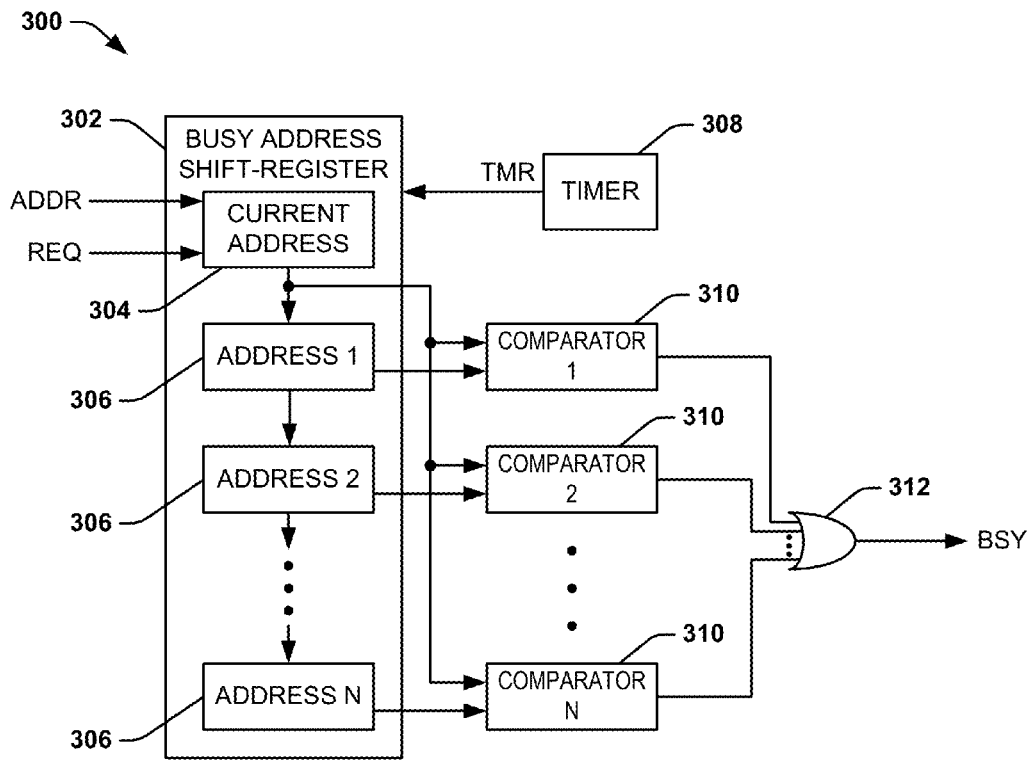
FIG. 7 illustrates another example of a timing controller.

FIG. 7 illustrates another example of a timing controller 300. The timing controller 300 can correspond to the timing controller 62 in the example of FIG. 2, and can be configured to monitor timing of read operations, such as described in the example of FIG. 4, and write operations, such as described in the example of FIG. 5. Therefore, reference is to be made to the example of FIGS. 2-5 in the following description of the example of FIG. 7. As an example, the timing controller 300 can be an alternative to the timing controller 250 in the example of FIG. 6. Additionally, the timing controller 300 can correspond to a single timing controller to generate a single busy signal BSY. Thus, the timing controller 62 in the example of FIG. 2 can include a plurality of timing controllers 300 that can each generate separate respective busy signals BSY (e.g., the busy signals $BSY_R$, $BSY_{WE}$, and $BSY_{WO}$, and/or a variety of others).

The timing controller 300 includes a busy address shift-register 302. The busy address shift-register 302 is configured as a shift-register memory to store address information associated with a selected one or more rows of the quantum memory cell array 54 (e.g., previously selected rows). In the example of FIG. 7, the busy address shift-register 302 includes a current address register 304 and a plurality N of address registers 306, where N is a positive integer. The current address register 304 is configured to receive both the address signal ADDR and the memory request signal REQ. Thus, the current address register 304 is configured to store address information (e.g., including row and/or associated set of the columns), such as in response to a request to access the address identified by the address signal ADDR via the memory request signal REQ. The current address register will store the requested address ADDR and an indication SUCCESS of whether the access request was granted.

In addition, the timing controller 300 can include a timer 308 that is configured to control a shifting of previously selected addresses (via the address signal ADDR) and its associated information (e.g. SUCCESS) within the address registers 306 of the busy-address shift-register 302 via a timing signal TMR. Thus, in response to receiving an address signal ADDR, the busy address shift-register 302 can be configured to store the corresponding address (e.g., including row and/or associated set of the columns) and its associated information (e.g. SUCCESS) in the current address register 304 and the address registers 306 arranged as a queue that is shifted via the timer 308. For example, each of the previously selected addresses stored in the address registers 306 can have a predetermined time associated with it that corresponds to the address becoming available (e.g., based on application of the respective read/write currents and flux recharge). As an example, the address can be stored in the shift register in order to mark the passage of time, and the shift register can be sized so that the address leaves the shift register when the desired amount of time has passed to allow the address to not be considered busy. Thus, the timing signal TMR can sequentially shift the address identified by the address signal ADDR and its associated information (e.g. SUCCESS) from the current address register 304 to a first of the address registers 306, along with each of the addresses stored in the address registers 306 and each address' associated information (e.g. SUCCESS) to a next sequential one of the address registers 306, with a last address in the $N^{th}$ address register 306 being removed from the busy address shift-register 302, based on expiration of the predetermined times (e.g., the expiration of the predetermined time of the last address in the $N^{th}$ address register 306). It is contemplated that the amount of time that an address and its associated information remain in the busy address shift-register 302 will correspond to the time necessary for the recovery of the flux pumps associated with the address. It is also to be understood that the shifting of the previously selected addresses can be accomplished in a variety of ways, and is not limited to use of the timer 308 (e.g., can be based on an external clock signal or a queue that is shifted at each cycle).

The timing controller 300 also includes a plurality N of comparators 306 that are configured to compare the currently selected row/address identified by the address signal ADDR and stored in the current address register 304 with the previously successfully (as indicated by the indication SUCCESS which is stored with each of the associated addresses) selected rows/addresses stored in each of the respective address registers 306 in response to the memory request signal REQ. For example, in response to receiving the memory request signal REQ, the comparators 310 can be configured to compare the selected row/address with each of the entries stored in the respective address registers 306 where the address was successfully accessed. Each of the comparators 306 includes an output that is coupled to a logic-OR gate 312 that provides the busy signal BSY at an output. Therefore, if any of the comparators 310 determine a match of the address in the current address register 304 with one of the addresses stored in the address registers 306, the respective one of the comparators 310 can provide a logic-high signal to the logic-OR gate 312 to indicate the match. The logic-OR gate 312 can provide the busy signal BSY at a logic-state (e.g., logic-high in the example of FIG. 7) corresponding to the selected address being prohibited for access. For example, the address controller 52 can queue the memory access associated with the memory request signal REQ until the busy signal BSY changes state from a logic-1 to a logic-0. Alternatively, the address controller 52 can attempt a different memory access, such as provided from a different memory request signal REQ, in response to an indication of prohibition of the respective memory access via the memory request signal REQ. Regardless, the current address register 304 can be configured to maintain the address indicated by the address signal ADDR in response to a successful memory access, such that the address indicated by the address signal ADDR can be maintained in the busy address shift-register 302, and thus shifted into the address registers 306, in response to a successful memory access, and is thus busy as described herein.

Figure 8:
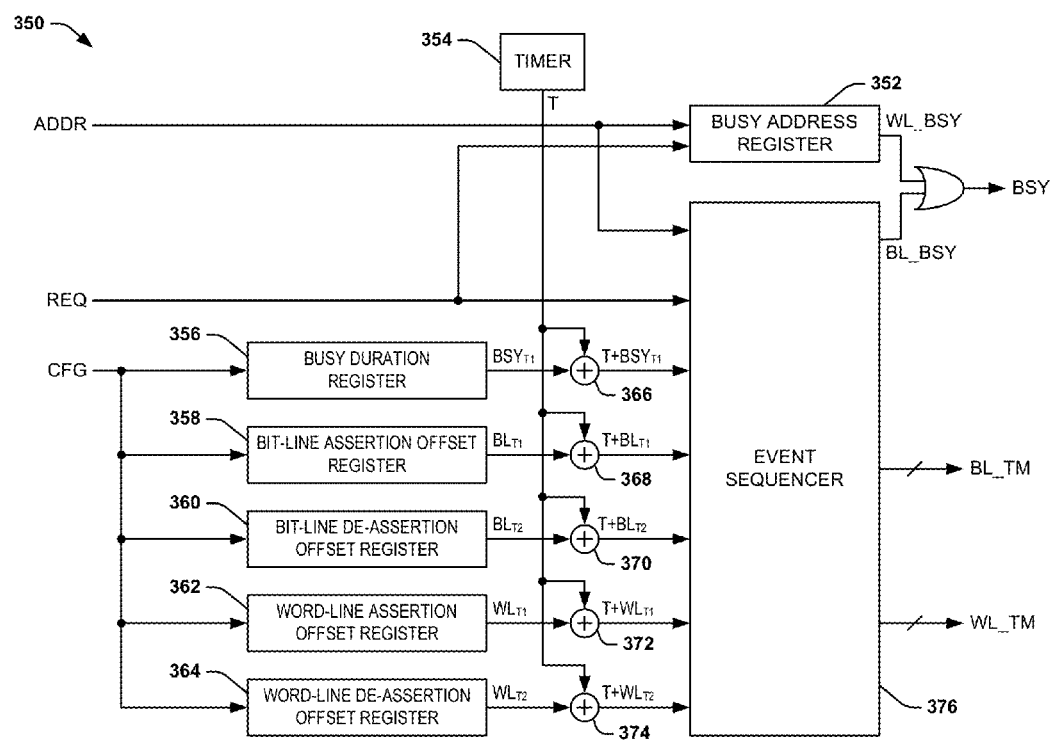
FIG. 8 illustrates yet another example of a timing controller.

FIG. 8 illustrates yet another example of a timing controller 350. The timing controller 350 can correspond to the timing controller 62 in the example of FIG. 2, and can be configured to monitor timing of read operations, such as described in the example of FIG. 4, and write operations, such as described in the example of FIG. 5. Therefore, reference is to be made to the example of FIGS. 2-5 in the following description of the example of FIG. 8. As an example, the timing controller 350 can include or can be an alternative to the timing controllers 250 and 300 in the examples of FIGS. 6 and 7. Additionally, the timing controller 350 can correspond to a single timing controller to generate a single busy signal BSY. Thus, the timing controller 62 in the example of FIG. 2 can include a plurality of timing controllers 350 that can each generate separate respective busy signals BSY (e.g., the busy signals $BSY_R$, $BSY_{W0}$, and $BSY_{W1}$, and/or a variety of others). In addition, as described herein, the timing controller 350 can be configured to control timing associated with bit-line and word-line memory accesses.

The timing controller 350 includes a busy address register 352. The busy address register 352 is configured to store address information associated with a selected one or more rows of the quantum memory cell array 54 (e.g., previously selected rows). In the example of FIG. 8, the timing controller 350 also includes a timer 354 that is configured as a real-time rollover timer configured to generate a timing signal T. In response to receiving an address signal ADDR and the memory request signal REQ, the busy address register 352 can be configured to store the corresponding address (e.g., including row and/or associated set of the columns) in the busy address register 352. The busy address register 352 can be configured to generate a word line busy signal WL_BSY which indicates the busy state of the word line circuitry associated with the address indicated by ADDR.

In addition, the timing controller 350 can include registers to control access to the flux pumps 56 and 58. In the example of FIG. 8, the registers include a busy duration register 356, a bit-line assertion offset register 358, a bit-line de-assertion offset register 360, a word-line assertion offset register 362, and a word-line de-assertion offset register 364. Each of the registers 356, 358, 360, 362, and 364 are configured to store predetermined time durations corresponding to the control of the flux pumps 56 and 58, as provided by a signal CFG. The busy duration register 356 can provide a register value $BSY_{T1}$ that corresponds to a predetermined time duration associated with the read operation or write operation of the selected address corresponding to the address signal ADDR (e.g., including flux recharge). The bit-line assertion offset register 358 can provide a register value $BL_{T1}$ that corresponds to a predetermined time duration associated with asserting the bit-write currents or the bit-read currents associated with the flux pumps 58, and thus a time offset to begin providing the corresponding bit-write currents or bit-read currents. The bit-line de-assertion offset register 360 can provide a register value $BL_{T2}$ that corresponds to a predetermined time duration associated with de-asserting the bit-write currents or the bit-read currents associated with the flux pumps 58, and thus a time offset to cease providing the corresponding bit-write currents or bit-read currents. The word-line assertion offset register 362 can provide a register value $WL_{T1}$ that corresponds to a predetermined time duration associated with asserting the word-write currents or the word-read currents associated with the flux pumps 56, and thus a time offset to begin providing the corresponding word-write currents or word-read currents. The word-line de-assertion offset register 364 can provide a register value $WL_{T2}$ that corresponds to a predetermined time duration associated with de-asserting the word-write currents or the word-read currents associated with the flux pumps 56, and thus a time offset to cease providing the corresponding word-write currents or word-read currents.

The timing controller 350 also includes adders associated with controlling access to the flux pumps 56 and 58. The register value $BSY_{T1}$ is provided to a first adder 366 that is configured to add the register value $BSY_{T1}$ to the real-time timing signal T to generate a predetermined time offset, demonstrated in the example of FIG. 8 as a value $T+BSY_{T1}$. An adder 368 adds the register value $BL_{T1}$ to the real-time timing signal T to generate a predetermined time offset $T+BL_{T1}$, and an adder 370 adds the register value $BL_{T2}$ to the real-time timing signal T to generate a predetermined time offset $T+BL_{T2}$. Additionally, an adder 372 adds the register value $WL_{T1}$ to the real-time timing signal T to generate a predetermined time offset $T+WL_{T1}$, and an adder 374 adds the register value $WL_{T2}$ to the real-time timing signal T to generate a predetermined time offset $T+WL_{T2}$. The predetermined time offsets $T+BSY_{T1}$, $T+BL_{T1}$, $T+BL_{T2}$, $T+WL_{T1}$, and $T+WL_{T2}$ thus increment in real-time at the same rate as the real-time timing signal T.

Each of the predetermined time offsets $T+BSY_{T1}$, $T+BL_{T1}$, $T+BL_{T2}$, $T+WL_{T1}$, and $T+WL_{T2}$ are provided to an event sequencer 376. The event sequencer 376 is configured to generate the busy signal BL_BSY, bit-line timing signals BL_TM that are configured to control respective bit-line flux pumps in the flux pumps 56 and 58 for addressing the respective portion of the quantum memory cell array 54, and word-line timing signals WL_TM that are configured to control respective word-line flux pumps in the flux pumps 56 and 58 to assert word-write currents, word-read-currents, and bit-write currents for addressing the respective portion of the quantum memory cell array 54. As an example, the event sequencer 376 can be one of a plurality of event sequencers that can control access to the flux pumps 56 and 58 to provide multiple accesses to the quantum memory cell array 54 and/or a bank of quantum memory cell arrays. As described herein, the event sequencer 376 receives the memory request signal REQ to determine when a memory access (e.g., for a read or write operation) is being requested. The event sequencer 376 also receives the real-time timing signal T and the predetermined time offsets $T+BSY_{T1}$, $T+BL_{T1}$, $T+BL_{T2}$, $T+WL_{T1}$, and $T+WL_{T2}$ which define thresholds to generate the bit line busy signal BL_BSY, the bit-line timing signals BL_TM and the word-line timing signals WL_TM. It is contemplated that the busy state of the bit-line control circuitry and the busy state of the word-line control circuitry can be tracked independently by the event sequencer 376 and the busy address register 352 respectively. When an access is requested, the timing controller 350 can generate a busy signal BSY that is generated by performing a logical OR of the word line busy signal WL_BSY and the bit line busy signal BL_BSY which are associated with the address ADDR associated with the access request.

Figure 9:
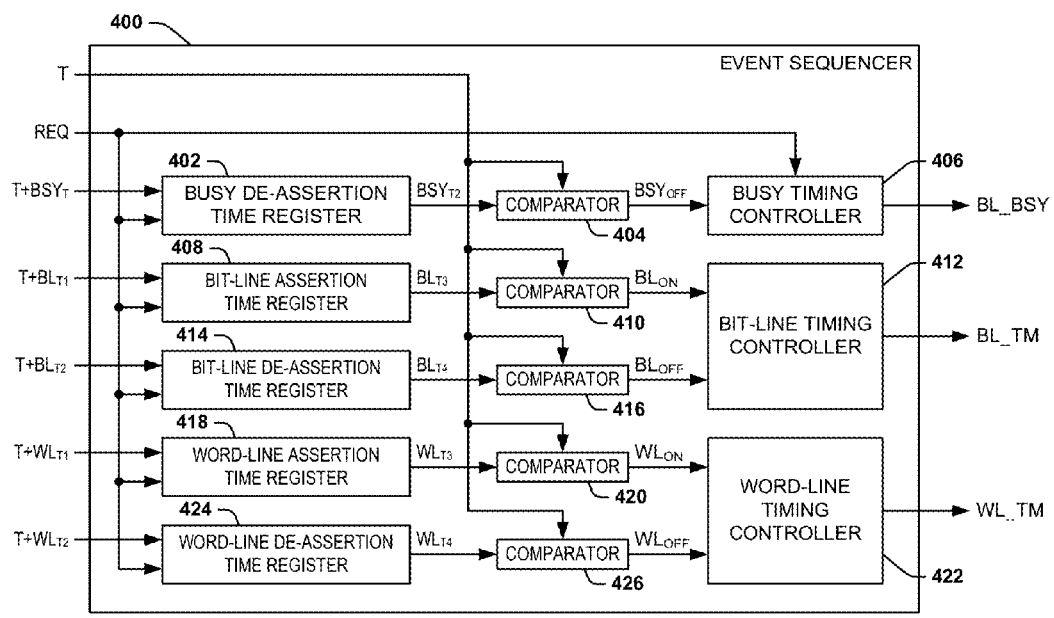
FIG. 9 illustrates an example of an event sequencer.

FIG. 9 illustrates an example of an event sequencer 400. As an example, the event sequencer 400 can correspond to the event sequencer 376 in the example of FIG. 8. Therefore, reference is to be made to the example of FIG. 8 in the following description of the example of FIG. 9. Accordingly, as described previously, the event sequencer 400 receives predetermined time offsets $T+BSY_{T1}$, $T+BL_{T1}$, $T+BL_{T2}$, $T+WL_{T1}$, and $T+WL_{T2}$ and the real-time timing signal T to define thresholds to generate the bit line busy signal BL_BSY, the bit-line timing signals BL_TM, and the word-line timing signals WL_TM.

The event sequencer 400 includes a busy de-assertion time register 402 which is configured to capture a value of the predetermined time offset $T+BSY_{T1}$ when an access request is indicated by the memory request signal REQ. The captured value of the predetermined time offset $T+BSY_{T1}$ is stored as a threshold $BSY_{T2}$ (e.g., until the next access request is indicated by the memory request signal REQ). The event sequencer 400 includes a comparator 404 that is configured to compare the value of the real-time timing signal T with the threshold $BSY_{T2}$, and generates a signal $BSY_{OFF}$ that is provided to a busy timing controller 406. The busy timing controller 406 is configured to generate the bit line busy signal BL_BSY, as described herein, to indicate whether a given address (e.g., row) is available or prohibited for access for a read or write operation. In the example of FIG. 9, the busy timing controller 406 is configured to receive the signal $BSY_{OFF}$ and the memory request signal REQ to determine when to assert the BL_BSY signal (e.g., to indicate that the address stored in the busy address register 352 is unavailable due to the need for the bit line circuitry to recover). Thus, during a memory request, as indicated by the memory request signal REQ, the busy timing controller 406 is configured to assert the bit line busy signal BL_BSY until the signal $BSY_{OFF}$ is asserted in response to a match of the real-time timing signal T with the threshold $BSY_{T2}$.

The event sequencer 400 also includes components associated with controlling the bit-line flux pumps 58. In the example of FIG. 9, the event sequencer 400 includes a bit-line assertion time register 408 which is configured to capture a value of the predetermined time offset $T+BL_{T1}$ when an access request is indicated by the memory request signal REQ. The captured value of the predetermined time offset $T+BL_{T1}$ is stored as a threshold $BL_{T3}$ (e.g., until the next access request is indicated by the memory request signal REQ). A comparator 410 compares the value of the real-time timing signal T with the threshold $BL_{T3}$, and provides a signal $BL_{ON}$ to a bit-line timing controller 412 that is configured to generate the bit-line timing signals BL_TM. The signal $BL_{ON}$ can correspond to a time to assert a given bit-line current via the bit-line flux pumps 58. Similarly, the event sequencer 400 includes a bit-line de-assertion time register 414 which is configured to capture a value of the predetermined time offset $T+BL_{T2}$ when an access request is indicated by the memory request signal REQ. The captured value of the predetermined time offset $T+BL_{T2}$ is stored as a threshold $BL_{T4}$ (e.g., until the next access request is indicated by the memory request signal REQ). A comparator 416 compares the value of the real-time timing signal T with the threshold $BL_{T4}$, and provides a signal $BL_{OFF}$ to the bit-line timing controller 412. The signal $BL_{OFF}$ can correspond to a time to de-assert the given bit-line current via the bit-line flux pumps 58. Therefore, the bit-line timing controller 412 is configured to use the signals $BL_{ON}$ and $BL_{OFF}$ to control the bit-line flux pumps 58 for addressing a respective portion of the quantum memory cell array 54.

The event sequencer 400 further includes components associated with controlling the write-line flux pumps 56. In the example of FIG. 9, the event sequencer 400 includes a write-line assertion time register 418 which is configured to capture a value of the predetermined time offset $T+WL_{T1}$ when an access request is indicated by the memory request signal REQ. The captured value of the predetermined time offset $T+WL_{T1}$ is stored as a threshold $WL_{T3}$ (e.g., until the next access request is indicated by the memory request signal REQ). A comparator 420 compares the value of the real-time timing signal T with the threshold $WL_{T3}$, and provides a signal $WL_{ON}$ to a write-line timing controller 422 that is configured to generate the write-line timing signals WL_TM. The signal $WL_{ON}$ can correspond to a time to assert a given write-line current via the write-line flux pumps 56. Similarly, the event sequencer 400 includes a write-line de-assertion time register 424 which is configured to capture a value of the predetermined time offset $T+WL_{T2}$ when an access request is indicated by the memory request signal REQ. The captured value of the predetermined time offset $T+WL_{T2}$ is stored as a threshold $WL_{T4}$ (e.g., until the next access request is indicated by the memory request signal REQ). A comparator 426 compares the value of the real-time timing signal T with the threshold $WL_{T4}$, and provides a signal $WL_{OFF}$ to the write-line timing controller 412. The signal $WL_{OFF}$ can correspond to a time to de-assert the given write-line current via the write-line flux pumps 56. Therefore, the write-line timing controller 422 is configured to use the signals $WL_{ON}$ and $WL_{OFF}$ to control the write-line flux pumps 56 for addressing a respective portion of the quantum memory cell array 54.

The timing controllers 250, 300, and 350 in the respective examples of FIGS. 6-8 thus provide separate different ways in which the address controller 52 can be provided with a status of the memory addresses provided in the memory request signal REQ prior to accessing the quantum memory cell array 54, and thus provide separate ways for efficiently managing the quantum memory system 50. Each of the timing controllers 250, 300, and 350 can be implemented for portions of a given one quantum memory cell array, such as to generate multiple busy signals BSY corresponding to separate read and write operations, and can correspond to each of several address registers. For example, the timing controller 350 in the example of FIG. 8 can be one of a plurality of timing controllers 350 that can each correspond to respective access requests from the quantum memory cell array 54. In addition, the timing controllers 250, 300, and 350 can be implemented across several different address banks, and thus across multiple quantum memory cell arrays.

It is contemplated that if the busy de-assertion time register 402 is configured with a high enough value, it can allow sufficient time for the recovery of both the bit-line flux pumps and the word-line flux pumps. Such an implementation of the busy de-assertion time register 402 can provide the same function with fewer hardware resources.

It should be noted that the Event Sequencer 400 can also be used to provide event timing control and sequencing for any general application and has scope beyond a quantum memory array and its associated circuitry.

In addition, it is to be understood that the event sequencer 400 could be one of a plurality of event sequencers, such that each of the plurality of event sequencers can control timing of the flux pumps 56 and 58 based on the same set of predetermined time offsets $T+BSY_{T1}$, $T+BL_{T1}$, $T+BL_{T2}$, $T+WL_{T1}$, and $T+WL_{T2}$ and the real-time timing signal T. In addition, it is to be understood that, in a system where an insufficient number of address registers or timing controllers exist to track the status of the entirety of active accesses, a saturation mechanism (as demonstrated in the example of FIG. 10) can be implemented to block all further accesses until the required address register and/or timing controller becomes available. Furthermore, as an example, it is contemplated that a timing controller may operate with a reduced address set and thus manage the busy status of the flux pumps associated with a plurality of word lines or column lines to reduce circuit area (e.g. comparators and register bits). Accordingly, a given quantum memory system 50 can be configured in a variety of different ways with respect to the timing controller 62.

Figure 10:
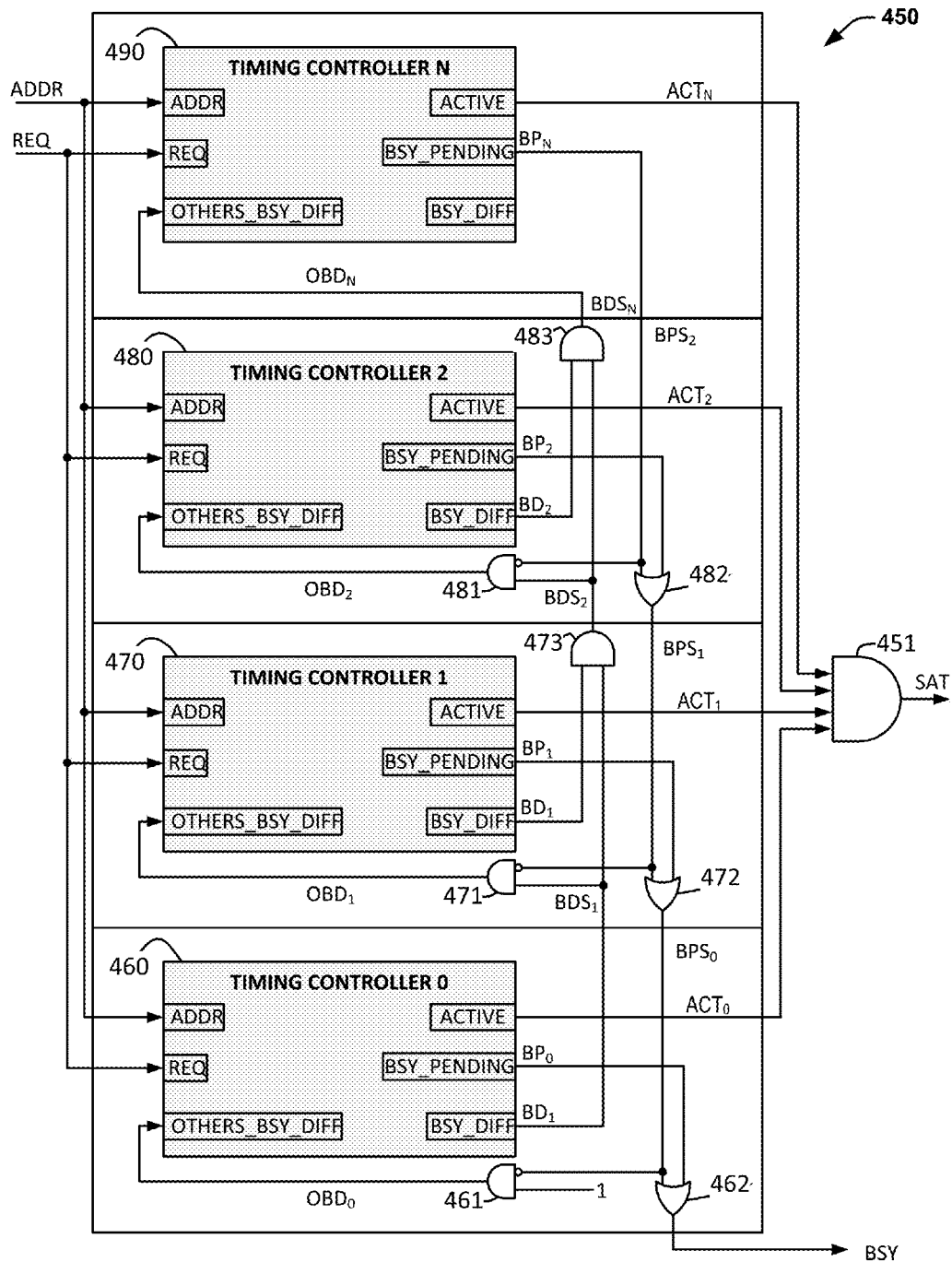
FIG. 10 illustrates an example of an array controller.

FIG. 10 illustrates an example of an array controller 450 where multiple timing controllers 250 are used in a cooperative fashion, along with additional support circuitry, to provide simultaneous busy-state tracking for a plurality of recovering addresses. Also, this example further illustrates how the queue admittance circuitry included in each timing controller 250 is coordinated within the array controller 450 and how the individual busy pending (BP) and activation (ACT) indications from each of N timing controllers 250, demonstrated as timing controllers 460, 470, 480, and 490 in the example of FIG. 10, can be used to collectively influence the behavior of the system.

When a timing controller grants access to an address, it must track the recovery state of the address in order to ensure that the memory controller 14, in the example of FIG. 1, does not attempt a second access to the same address before the flux pumps associated with that address have had sufficient time to recover. Each timing controller 250 has the ability to track the busy state of up to one recovering address. So, in order to grant the memory controller 14 multiple simultaneous memory access requests with concurrent recovery windows, multiple timing controllers 250 can be implemented. The use of a sufficient number of timing controllers 250 can allow for the system to avoid unnecessarily blocking access to the quantum memory system 16 by avoiding or minimizing the duration of a saturation condition which exists when there are no available timing controllers 250 to track the recovery state of a newly granted access request.

Coordination of multiple timing controllers can be implemented to provide for the coordination of these timing controllers so that it is deterministic which single timing controller grants a new access request and assumes the responsibility of tracking the recovery state associated with the address. The timing controllers 250 and the array controller 450 implement a cooperative queue admittance mechanism which is used to allow for this deterministic behavior and to guarantee that an address can only be considered busy by either zero timing controllers or one timing controller, but not more than one timing controller. One aspect of this requirement is that if a timing controller 250 is already tracking the recovery of an address, this same timing controller 250 must queue a new request to the same address through its conditional acceptance. Allowing a second timing controller 250 to queue this request as a new address can interfere with the first access request, such that the second timing controller 250 can be controlled to wait until the first access has completed and the associated circuits have recovered.

The system can also provide for how the reported status from the individual timing controllers is used collectively to influence the behavior of the memory controller. It can be beneficial, for example, to inform the memory controller in advance of it issuing a new access request if a saturation condition exists. And, when a saturation condition does not exist, the busy state can be reported regardless of which timing controller detects the busy state.

In the example of FIG. 10, the array controller 450 includes multiple timing controllers 460, 470, 480, and 490 which correspond to the timing controller 250. The timing controllers 250 and the array controller 450 together implement cooperative mechanisms for queue admittance, busy reporting, and saturation reporting. The description of these cooperative mechanisms will therefore refer both to FIG. 6 and FIG. 10.

Each of the timing controllers (e.g. 460, 470, 480, and 490) receive a copy of the REQ input signal which indicates that the memory controller is requesting a memory access, and each of the timing controllers receive a copy of the ADDR input signal which indicates that address to which access is being requested. Upon receipt of the access request, all N instances of the timing controller 250 can temporarily queue the request in the pending access address register 264 until each timing controller 250 determines whether it should ignore the request, grant the request, or conditionally accept the request (leaving it queued until it can be granted). A given one of these timing controllers 250 can determine that the request should be granted or at least conditionally accepted. All other timing controllers 250 can determine that the request should be ignored causing those timing controllers 250 to clear the request pending memory 268 in preparation for the next request.

The array controller 450 provides the necessary logic gates along with the necessary signal connectivity to enable each timing controller 250 to determine whether it should ignore or conditionally accept the access request. The cooperative queue admittance mechanism is configured so that a timing controller 250 that is actively tracking the recovery of the address that is being requested can have the highest priority and can make the determination to queue the newly requested access to the same address. All other timing controllers 250 can have a lower priority in queuing the new request and can make the determination to ignore the request. The cooperative queue admittance mechanism is also configured so that if there are no timing controllers 250 that are actively tracking the recovery of the address that is being requested, then the lowest numbered timing controller that is not actively tracking the recovery of an address can have the next highest priority and can make the determination to admit the new address to which access is being requested to its queue. All other timing controllers 250 can have a lower priority in the queue admittance and can make the determination to ignore the request. Finally, if all timing controllers 250 are actively tracking address recovery, then a saturate condition can exist and the memory controller can be notified of this saturate condition in order to prevent new requests from being issued that cannot be accepted by any timing controller 250.

The OR logic gates 462, 472, and 482 summarize and propagate the busy pending status from the higher numbered Timing Controllers to the lower numbered Timing Controllers. Each timing controller communicates its busy pending status via its corresponding BP signal and the OR logic gates 482, 472, and 462 combine these BP signals to produce BPS signals which, at each stage, indicate whether or not a higher numbered timing controller is busy tracking the recovery of the address that matches the address of the newly requested and temporarily pending access request.

Likewise, the AND logic gates 473 and 483 summarize and propagate the busy different address (i.e. BD) status from the lower numbered Timing Controllers to the higher numbered Timing Controllers. Each timing controller communicates its busy different address status via its corresponding BD signal and the AND logic gates 473 and 483 combine these BD signals to produce BDS signals which, at each stage, indicate whether or not a lower numbered timing controller is busy tracking the recovery of an address that does not match the address of the newly requested access and temporarily pending access request.

The A and not B logic gates 461, 471, and 481 produce the OBD signal for each timing controller that indicates to that timing controller whether or not it has been designated as having the priority in conditionally accepting and granting the access request. In the example of FIG. 10, the signal $BDS_N$ and the signal $OBD_N$ are demonstrated as the same signal based on the output of the AND gate 483. If a given timing controller is informed via its BDS signal that all lower numbered timing controllers are busy tracking a different address, and if it is informed via its BPS signal that none of the higher numbered timing controllers are already tracking this address, then the OBD signal can indicate to it that it should accept this new request into its queue as long as it is not currently active tracking a recovering address.

The array controller 450 also includes the OR logic gate 462 which is configured to generate the BSY output signal if either the $BP_0$ signal or the $BPS_0$ has been indicated. The array controller 450 also includes the AND logic gate 451 which is configured to generate the SAT signal if all the ACT signals have a logic 1 value. Therefore, the SAT signal can be asserted if all of the timing controllers are busy tracking a recovering address so that the memory controller can be prohibited from requesting any additional accesses until the saturate condition indicated by the SAT signal concludes.

FIG. 10 illustrates an array controller 450 comprised of four timing controllers (i.e. 460, 470, 480, and 490), but this is simply an example. The actual number of timing controllers 250 that could comprise the array controller 450 can range from a single timing controller to many (e.g. N) timing controllers. FIG. 10 is also meant to illustrate three usage scenarios for the timing controller where each of the three usage scenarios can require slightly different supporting logic gates and signal connectivity in order to facilitate the desired behavior as a component in the array controller 450. The first usage scenario is where a timing controller 250 is the first (i.e. lowest numbered) timing controller in the chain. The timing controller 460 is the first timing controller in the chain shown in FIG. 10. Because it is the first, it does not receive a BDS input and therefore does not need the AND logic gate to combine this signal with its own $BD_0$ signal. Also, the A and not B logic gate 461 must substitute a logic-1 for the missing BDS input signal. The second usage scenario is where the timing controller 250 is in the middle of a chain of timing controllers. This is illustrated in FIG. 10 by both Timing Controller 470 and Timing Controller 480. Timing Controller 470, for example requires the logic gates 471, 472, and 473 in order to appropriately combine and propagate the signals necessary for the timing controller 470 to operate within the array controller 450. Finally, the third usage scenario is where a timing controller 250 is used as the last timing controller in a chain of timing controllers. This is illustrated in FIG. 10 by timing controller 490. Because timing controller 490 is the last in the chain, it does not require any of the logic gates used in the other two usage scenario. This is because it is either the source of a signal or the terminal destination of a signal. It does not need to combine and propagate any signals as in the other two usage scenarios.

Figure 11:
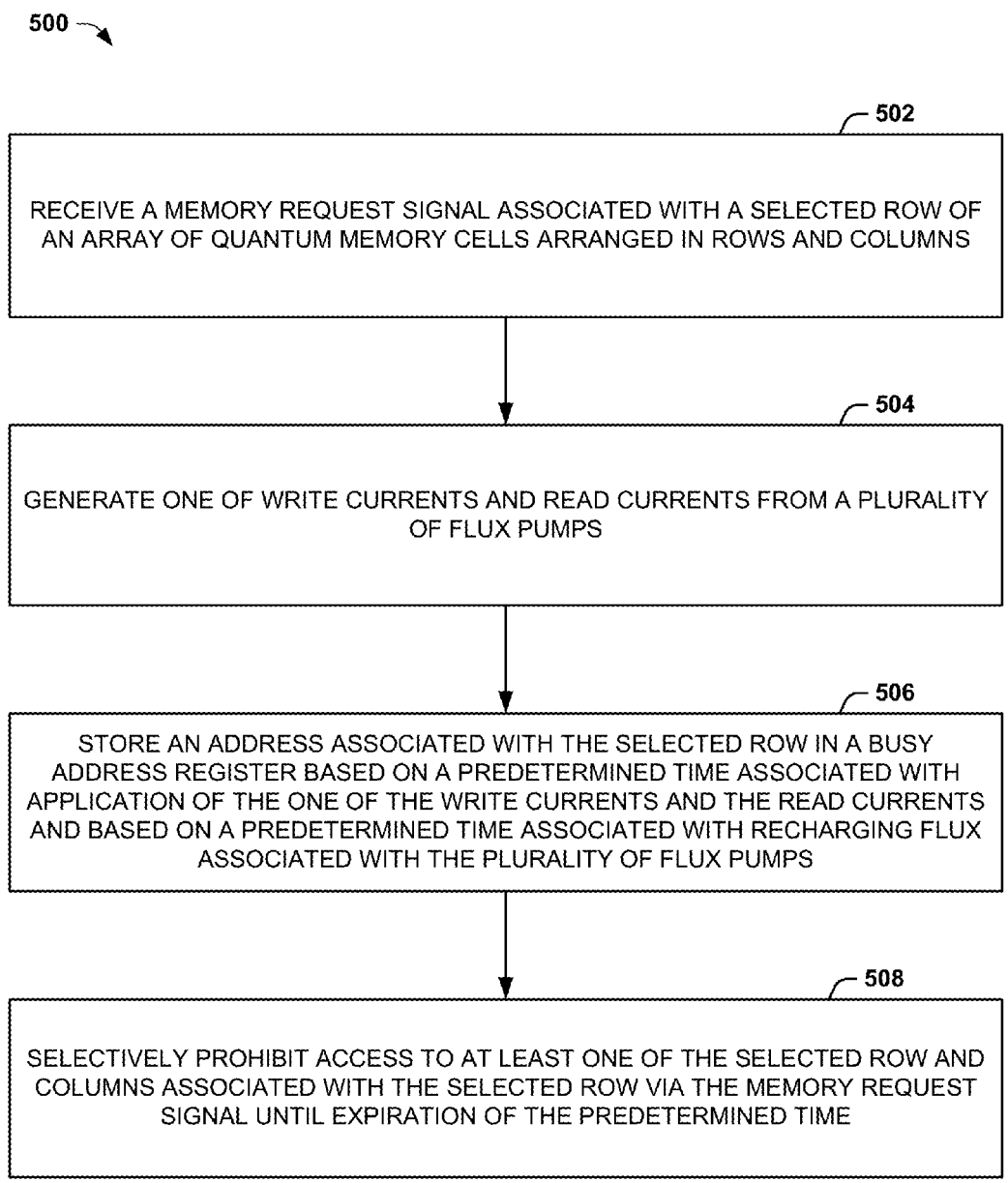
FIG. 11 illustrates an example of a method for reading and writing data in a quantum memory system.

In view of the foregoing structural and functional features described above, a methodology in accordance with various aspects of the present invention will be better appreciated with reference to FIG. 11. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 11 illustrates an example of a method 500 for reading and writing data in a quantum memory system (e.g., the quantum memory system 50). At 502, a memory request signal (e.g., the memory request signal REQ) associated with a selected row of an array of quantum memory cells (e.g., the quantum memory cell array 54) arranged in rows and columns is received. At 504, one of write currents (e.g., the word-write currents WWL and bit-write currents BWL) and read currents (e.g., the word-read currents WRL and bit-read currents BRL) is generated from a plurality of flux pumps (e.g., the flux pumps 56 and 58). The one of the write currents and the read currents can be provided to the array of quantum memory cells to one of write data to and read data from the selected row, respectively, in response to the memory request signal. At 506, an address associated with the selected row is stored in a busy address register (e.g., the busy address register 64) based on a predetermined time associated with application of the one of the write currents and the read currents and based on a predetermined time associated with recharging flux associated with the plurality of flux pumps. At 508, access to at least one of the selected row and columns associated with the selected row via the memory request signal is selectively prohibited until expiration of the predetermined time.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A quantum memory system comprising:
    a plurality of quantum memory cells arranged in an array of rows and columns, each of the plurality of quantum memory cells being configured to store a binary logic state in response to write currents in a write operation and configured to provide an indication of the binary logic state in response to read currents in a read operation; and
    an array controller comprising a plurality of flux pumps configured to provide the write currents and the read currents with respect to the rows and columns, the array controller being configured to control timing associated with the write operation and the read operation in response to memory request signals based on application of the write currents and the read currents and based on recharging flux associated with the plurality of flux pumps.

2. The system of claim 1, wherein the array controller comprises a timing controller configured to generate a busy signal in response to a given one of the memory request signals based on application of conflicting write currents or conflicting read currents or based on insufficient flux of a respective one or more of the plurality of flux pumps associated with the selected row or the columns of the array of rows and columns, the busy signal comprising a first state to allow a respective one of the write operation and the read operation and a second state to prohibit the respective one of the write operation and the read operation.

3. The system of claim 2, wherein the array controller further comprises an address controller configured to receive the memory request signals and to generate address signals to control the plurality of flux pumps to provide the write currents to write the binary logic state to a selected row of the array of rows and columns or to provide the read currents to read the binary logic state from a selected row of the array of rows and columns.

4. The system of claim 3, wherein the timing controller comprises:
a busy address register configured to store previously selected rows based on the application of conflicting write currents or conflicting read currents or based on insufficient flux of a respective one or more of the plurality of flux pumps associated with the selected row or the columns of the array of rows and columns; and
a comparator configured to generate the busy signal based on a comparison of one of a time and an address associated with the selected row based on the memory request signals with a respective one of a time associated with the previously selected rows and addresses associated with the previously selected rows.

5. The system of claim 4, wherein the timing controller further comprises a timer, wherein the timing controller is further configured to add a plurality of predetermined times associated with one of the write operation and the read operation to a current time associated with the timer to generate a plurality of predetermined threshold times, wherein the comparator is one of a plurality of comparators configured to generate the busy signal and to generate control signals associated with the plurality of flux pumps based on the comparison of the current time with the plurality of predetermined threshold times via the respective plurality of comparators.

6. The system of claim 4, wherein the timing controller further comprises a timer, and wherein the busy address register is configured as a shift register that is controlled by the timer to sequentially shift the previously selected rows in a queue, wherein the comparator is configured to compare a last one of the previously selected rows in the queue with a selected row associated with the memory request signals to generate the busy signal.

7. The system of claim 4, wherein the timing controller further comprises at least one timer associated with each of the previously selected rows, wherein the comparator is configured to compare the selected row associated with the memory request signals with each of the previously selected rows based on the at least one timer to generate the busy signal.

8. The system of claim 1, wherein the array of rows and columns comprises an array of rows and a plurality of sets of columns, the plurality of sets of columns being interleaved with respect to each other, wherein each of the plurality of sets of columns are associated with a separate and distinct data word within a given one of the rows.

9. The system of claim 8, wherein the array controller is configured to control a reading of data from or a writing of data to a first row of the rows via a first set of the plurality of sets of columns while flux associated with a second row of the rows and a second set of the plurality of sets of columns is recharging during a predetermined recharge time.

10. The system of claim 8, wherein the array controller is configured to control a reading of data from or a writing of data to a first row of the rows via a first set of the plurality of sets of columns after expiration of a predetermined recharge time associated with recharging of flux of the first row of the rows and the first set of the plurality of sets of columns.

11. A memory system comprising the quantum memory system of claim 1, the memory system further comprising a memory controller configured to generate the memory request signals to read data from and write data from the quantum memory system in response to commands from a central processing unit (CPU).

12. A method for reading and writing data in a quantum memory system, the method comprising:
receiving a memory request signal associated with a selected row of an array of quantum memory cells arranged in rows and columns;
generating one of write currents and read currents from a plurality of flux pumps, the one of the write currents and the read currents being provided to the array of quantum memory cells to one of write data to and read data from the selected row, respectively, in response to the memory request signal;
storing an address associated with the selected row in a busy address register based on a predetermined time associated with application of the one of the write currents and the read currents and based on a predetermined time associated with recharging flux associated with the plurality of flux pumps; and
selectively prohibiting access to at least one of the selected row and columns associated with the selected row via the memory request signal until expiration of the predetermined time.

13. The method of claim 12, wherein selectively prohibiting access comprises generating a busy signal comprising a first state to allow a respective one of a write operation and a read operation and a second state to prohibit the respective one of the write operation and the read operation in response to the memory request signal selecting at least one of the selected row and columns associated with the selected row prior to expiration of the predetermined time.

14. The method of claim 12, wherein selectively prohibiting access comprises:
comparing the selected row associated with the memory request signal with each of a plurality of previously selected rows in the busy address register;
enabling one of a write operation and a read operation with respect to the selected row associated with the memory request signal in response to the comparison yielding no match; and
prohibiting the one of the write operation and the read operation with respect to the selected row associated with the memory request signal in response to the comparison yielding a match.

15. The method of claim 12, wherein generating the one of the write currents and the read currents comprises:
generating one of a word-write current and a word-read current associated with each of the quantum memory cells in the selected row; and
generating one of a plurality of bit-write currents and a plurality of bit-read currents associated with each of the quantum memory cells in one of a plurality of sets of columns, the plurality of sets of columns being interleaved with respect to each other, wherein each of the plurality of sets of columns are associated with a separate and distinct data word within a given one of the rows.

16. The method of claim 15, wherein selectively prohibiting access comprises:
reading data from or writing data to a first row of the rows via a first set of the plurality of sets of columns based on the respective read or write currents;
incrementing a timer associated with the predetermined time associated with the first row and the first set of the plurality of sets of columns; and reading data from or writing data to a second row of the rows via a second set of the plurality of sets of columns based on the respective read or write currents prior to expiration of the timer associated with the predetermined time.

17. A memory system comprising:
a memory controller configured to generate memory request signals in response to commands from a central processing unit (CPU); and
a quantum memory system comprising:
  a plurality of quantum memory cells arranged in an array of rows and columns, each of the plurality of quantum memory cells being configured to store a binary logic state in response to write currents in a write operation and configured to provide an indication of the binary logic state in response to read currents in a read operation; and
  an array controller comprising a plurality of flux pumps configured to provide the write currents and the read currents with respect to the rows and columns, the array controller being configured to control timing associated with the write operation and the read operation in response to memory request signals based on a predetermined time associated with application of the write currents and the read currents and associated with recharging flux associated with the plurality of flux pumps.

18. The system of claim 17, wherein the array controller comprises:
a timing controller configured to generate a busy signal in response to a given one of the memory request signals based on application of conflicting write currents or conflicting read currents or based on insufficient flux of a respective one or more of the plurality of flux pumps associated with the selected row or the columns of the array of rows and columns, the busy signal comprising a first state to allow a respective one of the write operation and the read operation and a second state to prohibit the respective one of the write operation and the read operation; and
an address controller configured to receive the memory request signals and to generate address signals to control the plurality of flux pumps to provide the write currents to write the binary logic state to a selected row of the array of rows and columns or to provide the read currents to read the binary logic state from a selected row of the array of rows and columns.

19. The system of claim 17, wherein the array of rows and columns comprises an array of rows and a plurality of sets of columns, the plurality of sets of columns being interleaved with respect to each other, wherein each of the plurality of sets of columns are associated with a separate and distinct data word within a given one of the rows.

20. The system of claim 19, wherein the array controller is configured to control a reading of data from or a writing of data to a first row of the rows via a first set of the plurality of sets of columns while flux associated with a second row of the rows and a second set of the plurality of sets of columns is recharging during the predetermined time.

\* \* \* \* \*